(12) United States Patent
Park et al.

(10) Patent No.: US 9,960,241 B2
(45) Date of Patent: May 1, 2018

(54) SEMICONDUCTOR DEVICE FOR MANUFACTURING

(71) Applicant: Samsung Electronics Co., Ltd., Suwon-Si, Gyeonggi-do (KR)

(72) Inventors: Sangjine Park, Yongin-si (KR); Kee Sang Kwon, Seoul (KR); Jae-Jik Baek, Seongnam-si (KR); Boun Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 90 days.

(21) Appl. No.: 14/989,485

(22) Filed: Jan. 6, 2016

(65) Prior Publication Data

US 2016/0284806 A1 Sep. 29, 2016

(30) Foreign Application Priority Data

Mar. 23, 2015 (KR) .................. 10-2015-0040071

(51) Int. Cl.
| | |
|---|---|
| *H01L 29/417* | (2006.01) |
| *H01L 29/78* | (2006.01) |
| *H01L 29/06* | (2006.01) |
| *H01L 29/51* | (2006.01) |
| *H01L 29/423* | (2006.01) |
| *H01L 27/088* | (2006.01) |
| *H01L 21/8234* | (2006.01) |

(52) U.S. Cl.
CPC .... *H01L 29/41791* (2013.01); *H01L 29/0649* (2013.01); *H01L 29/41758* (2013.01); *H01L 29/41783* (2013.01); *H01L 29/42364* (2013.01); *H01L 29/51* (2013.01); *H01L 29/785* (2013.01); *H01L 21/823431* (2013.01); *H01L 21/823475* (2013.01); *H01L 27/0886* (2013.01)

(58) Field of Classification Search
CPC . H01L 29/785; H01L 29/41; H01L 21/76897; H01L 29/41791; H01L 29/41783
See application file for complete search history.

(56) References Cited

U.S. PATENT DOCUMENTS

| | | | |
|---|---|---|---|
| 7,898,041 B2* | 3/2011 | Radosavljevic | .. H01L 29/41791 257/213 |
| 8,263,451 B2* | 9/2012 | Su | .......... H01L 29/785 257/190 |
| 8,358,012 B2* | 1/2013 | Haran | ............... H01L 21/28518 257/382 |
| 2012/0202335 A1 | 8/2012 | Lee et al. | |
| 2012/0241852 A1* | 9/2012 | Sasaki | ............... H01L 29/66621 257/331 |

(Continued)

*Primary Examiner* — Jose R Diaz
(74) *Attorney, Agent, or Firm* — Ward and Smith, P.A.

(57) ABSTRACT

A semiconductor device includes an active pattern protruding from a substrate, gate structures crossing over the active pattern, gate spacers on sidewalls of the gate structures, a source/drain region in the active pattern between the gate structures, and a source/drain contact on and connected to the source/drain region. The source/drain contact includes a first portion between the gate structures and being in contact with the gate spacers, a second portion on the first portion and not being in contact with the gate spacers, and a third portion on the second portion. A first boundary between the second and third portions is at the substantially same height as a top surface of the gate structure.

20 Claims, 38 Drawing Sheets

(56) References Cited

U.S. PATENT DOCUMENTS

| | | |
|---|---|---|
| 2013/0023127 A1 | 1/2013 | Chang et al. |
| 2013/0234253 A1 | 9/2013 | Toh et al. |
| 2014/0084384 A1 | 3/2014 | Choi et al. |
| 2014/0162427 A1 | 6/2014 | Gwak |
| 2014/0193976 A1 | 7/2014 | Kim et al. |
| 2014/0210087 A1 | 7/2014 | Kang |
| 2014/0220754 A1 | 8/2014 | Min |
| 2014/0220782 A1 | 8/2014 | Seo |

\* cited by examiner

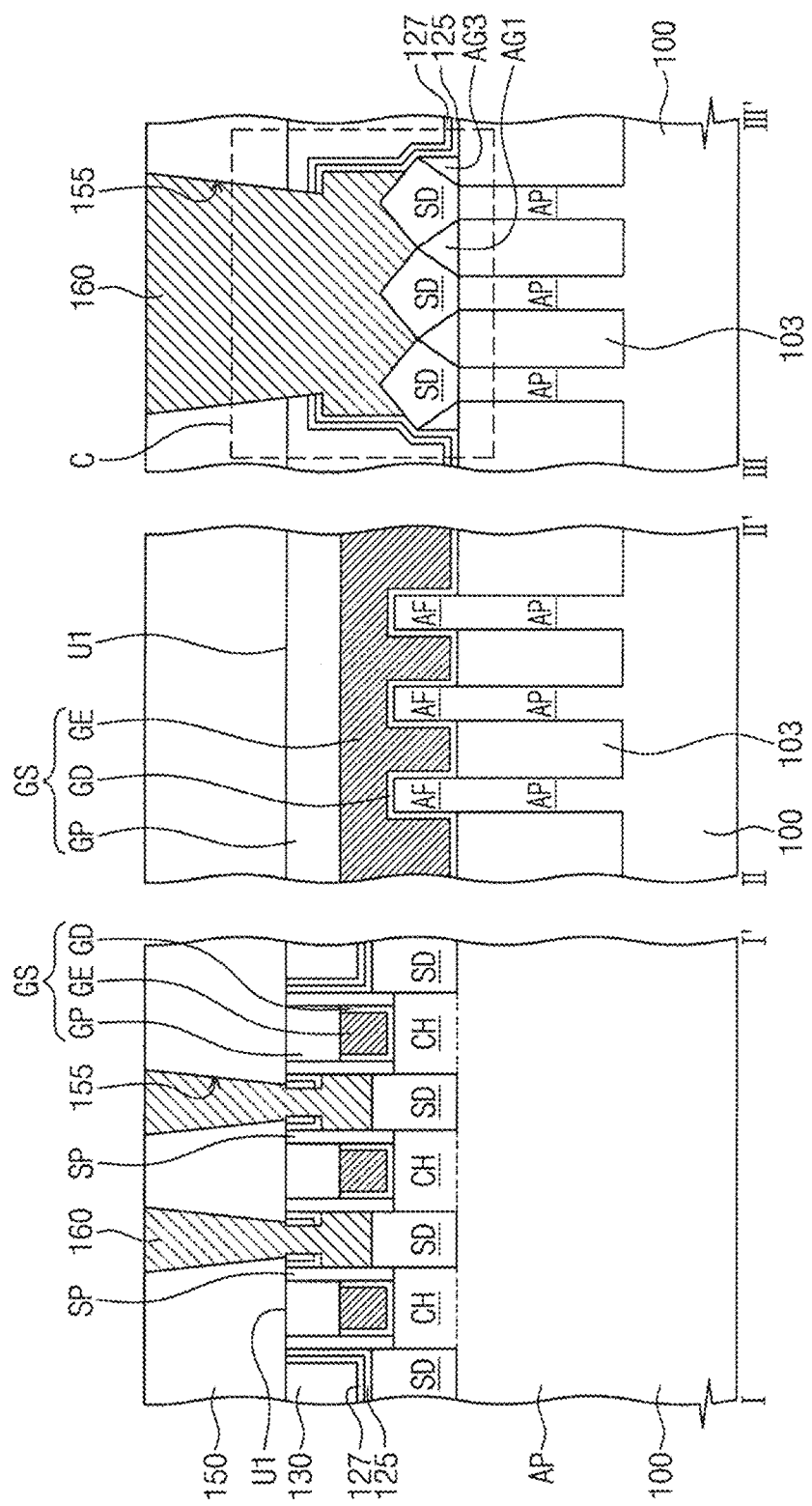

SEMICONDUCTOR DEVICE FOR MANUFACTURING

CROSS-REFERENCE TO RELATED APPLICATION

This application claims priority under 35 U.S.C. § 119 to Korean Patent Application No. 10-2015-0040071, filed on Mar. 23, 2015, in the Korean Intellectual Property Office, the disclosure of which is hereby incorporated by reference in its entirety.

BACKGROUND

The inventive concepts relate to semiconductor devices and, more particularly, to semiconductor devices including fin field effect transistor devices and methods of forming the same.

Semiconductor devices may include an integrated circuit including metal-oxide-semiconductor field effect transistors (MOSFETs). As the sizes and design rules of semiconductor devices have been reduced, the sizes of MOSFETs have been scaled down. The operating characteristics of semiconductor devices may be degraded due to the scale-down of the MOSFETs. Thus, research is being conducted for the purpose of developing semiconductor devices that can overcome the limitations caused by increases in integration density.

SUMMARY

Embodiments of the inventive concepts may provide a semiconductor device capable of improving electrical characteristics and a method for manufacturing the same.

In one aspect, a semiconductor device may include an active pattern protruding from a substrate, gate structure crossing over the active pattern, gate spacer on a sidewall of the gate structure, a source/drain region disposed on the active pattern at a side of the gate structure, and a source/drain contact disposed on the source/drain region so as to be connected to the source/drain region. The source/drain contact may include a first portion disposed at the side of the gate structure and being in contact with the gate spacer, a second portion disposed on the first portion and being spaced apart from the gate spacer, and a third portion disposed on the second portion. A first boundary between the second and third portions may be disposed at the substantially same height as a top surface of the gate structure.

In an embodiment, the first portion may be connected to the second portion and the second portion may be connected to the third portion such that the first, second, and third portions may constitute one body.

In an embodiment, the semiconductor device may further include an insulating material between the second portion and the gate spacer.

In an embodiment, the insulating material may include a first insulating layer being in contact with the gate spacer, and a second insulating layer between the first insulating layer and the second portion. The first and second insulating layers may include different materials from each other.

In an embodiment, the first insulating layer may include a silicon oxide layer or a porous silicon oxy-hydrocarbon layer.

In an embodiment, the second insulating layer may include the same material as the gate spacer.

In an embodiment, the gate structure may include a gate electrode crossing over the active pattern, a gate capping pattern on the gate electrode, and a gate dielectric pattern between the active pattern and the gate electrode. The height of the top surface of the gate structure may be defined as a height of a top surface of the gate capping pattern. A second boundary between the first and second portions may be lower than the top surface of the gate capping pattern and may be higher than a top surface of the gate electrode.

In an embodiment, the gate structure may include a gate electrode crossing over the active pattern, and a gate dielectric pattern between the active pattern and the gate electrode. The height of the top surface of the gate structure may be defined as a height of a top surface of the gate electrode.

In an embodiment, the active pattern may extend in a first direction, and the gate structure may extend in a second direction intersecting the first direction. A first width of the first portion may be greater than a second width of the second portion when viewed from a cross-sectional view taken along the first direction.

In an embodiment, a third width of the first portion may be greater than a fourth width of the second portion when viewed from a cross-sectional view taken along the second direction.

In an embodiment, a third width of the first portion may be smaller than a fourth width of the second portion when viewed from a cross-sectional view taken along the second direction.

In an embodiment, the second portion may include an extension disposed at a lower level than a second boundary between the first and second portions, and the extension may be spaced apart from the first portion.

In an embodiment, an insulating material may be disposed between the extension and the first portion.

In an embodiment, a profile of a first sidewall of the first portion and a second sidewall of the second portion adjacent thereto may be discontinuous when viewed from a cross-sectional view taken along the second direction, and a profile of the second sidewall and a third sidewall of the third portion adjacent thereto may be continuous when viewed from the cross-sectional view taken along the second direction.

In an embodiment, the source/drain region may include a lower portion being in contact with the active pattern and having substantially negatively inclined sidewalls, and an upper portion extending from the lower portion and having substantially positively inclined sidewalls.

In an embodiment, air gaps may be formed under the sidewalls of the lower portion.

In an embodiment, the active pattern may include a plurality of active patterns, and the source/drain region may include a plurality of source/drain regions respectively disposed on the plurality of active patterns. The source/drain contact may cross over the plurality of active patterns and may be connected in common to the plurality of source/drain regions.

In an embodiment, each of the plurality of source/drain regions may include a lower portion being in contact with each of the active patterns, the lower portion having a width that substantially increases as a distance from the substrate increases; and an upper portion extending from the lower portion, the upper portion having a width that substantially decreases as a distance from the substrate increases. The first portion may be in contact with the upper portion of each of the plurality of source/drain regions.

In an embodiment, the first portion may extend into between the source/drain regions adjacent to each other so as to be in contact with the lower portions of the adjacent source/drain regions.

In an embodiment, sidewalls of the source/drain regions adjacent to each other may be in contact with each other.

In another aspect, a semiconductor device may include active patterns protruding from a substrate, extending in a first direction, and arranged along a second direction intersecting the first direction, gate structures extending in the second direction to cross over the active patterns, gate spacers on sidewalls of the gate structures, a plurality of source/drain regions respectively disposed on the active patterns between the gate structures, and a source/drain contact connected to at least one of the plurality of source/drain regions. The source/drain contact may include a first portion being in contact with the at least one source/drain region, a second portion extending from the first portion and disposed at a lower level than top surfaces of the gate structures, and a third portion extending from the second portion and disposed at a higher level than the top surfaces of the gate structures. A first width of the first portion may be greater than a second width of the second portion when viewed from a cross-sectional view taken along the first direction.

In an embodiment, the first portion may be in contact with the gate spacers, and the second portion may not be in contact with the gate spacers.

In an embodiment, a profile of a first sidewall of the first portion and a second sidewall of the second portion adjacent thereto may be discontinuous when viewed from a cross-sectional view taken along the second direction, and a profile of the second sidewall and a third sidewall of the third portion adjacent thereto may be continuous when viewed from the cross-sectional view taken along the second direction.

In an embodiment, a third width of the first portion may be greater than a fourth width of the second portion when viewed from the cross-sectional view taken along the second direction.

In an embodiment, a third width of the first portion may be smaller than a fourth width of the second portion when viewed from the cross-sectional view taken along the second direction.

In an embodiment, each of the gate structures may include a gate electrode on the active patterns, a gate capping pattern on the gate electrode, and a gate dielectric pattern between the gate electrode and the active patterns. A boundary between the first and second portions may be lower than a top surface of the gate capping pattern and may be higher than a top surface of the gate electrode.

In an embodiment, the semiconductor device may further include device isolation patterns disposed on the substrate and covering portions of sidewalls of the active patterns, and a contact etch stop layer disposed on the device isolation patterns. A portion of the contact etch stop layer may extend onto sidewalls of the first portion.

In an embodiment, another portion of the contact etch stop layer may extend onto the sidewalls of the gate structures to partially cover the gate spacers. The another portion of the contact etch stop layer may be disposed between the second portion and the gate spacers but may not be disposed between the first portion and the gate spacers.

In an embodiment, the semiconductor device may further include a capping layer disposed between the contact etch stop layer and the device isolation patterns, between the contact etch stop layer and the sidewalls of the first portion, and between the second portion and the contact etch stop layer. The capping layer and the contact etch stop layer may include different materials from each other.

In still another aspect, a method for manufacturing a semiconductor device may include forming an active pattern protruding from a substrate, forming sacrificial gate patterns crossing over the active pattern, forming a source/drain region on the active pattern between the sacrificial gate patterns, forming a sacrificial contact pattern on the source/drain region, replacing the sacrificial contact pattern with a conductive pattern, and replacing the sacrificial gate patterns with gate electrodes. The sacrificial contact pattern may include a hydrocarbon-based insulating material, and a top surface of the sacrificial contact pattern may be lower than top surfaces of the sacrificial gate patterns.

In an embodiment, the method may further include forming gate spacers on sidewalls of the sacrificial gate patterns. The sacrificial contact pattern may be in contact with the gate spacers.

In an embodiment, replacing the sacrificial contact pattern with the conductive pattern may include forming a capping layer covering sidewalls and a top surface of the sacrificial contact pattern, removing the sacrificial contact pattern to form an air gap in a space from which the sacrificial contact pattern is removed, and filling the air gap with a conductive material.

In an embodiment, removing the sacrificial contact pattern may include performing an ashing process to evaporate the sacrificial contact pattern.

In an embodiment, the capping layer may include a silicon oxide layer or a porous silicon oxy-hydrocarbon layer.

In an embodiment, the method may further include forming a contact etch stop layer covering the capping layer on the substrate after the formation of the air gap, and forming an interlayer insulating layer covering top surfaces of the gate electrodes on the contact etch stop layer.

In an embodiment, filling the air gap with the conductive material may include forming a contact hole that penetrates the interlayer insulating layer, the contact etch stop layer, and the capping layer to open the air gap. The conductive material may fill the air gap and the contact hole.

In an embodiment, replacing the sacrificial gate patterns with the gate electrodes may include removing the sacrificial gate patterns to form gap regions exposing the active pattern, forming the preliminary gate electrodes filling the gap regions, respectively, and recessing the preliminary gate electrodes. Top surfaces of the gate electrodes may be lower than a top surface of the air gap.

In an embodiment, the active pattern may be formed in plurality, and the source/drain region may be formed in plurality such that the source/drain regions are disposed on the active patterns, respectively. The sacrificial contact pattern may cross over the active patterns and may be connected in common to the plurality of source/drain regions.

A semiconductor device according to further embodiments includes an active fin on a substrate, a gate structure crossing over the active fin, a source/drain region on the substrate adjacent the gate structure, a source/drain contact on the source/drain region and connected to the source/drain region, wherein the source/drain contact comprises a first portion in contact with the source/drain region and a second portion disposed on the first portion, and a gas-permeable capping layer on an upper surface of the first portion of the source/drain contact. The second portion of the source/drain contact extends through the gas-permeable capping layer to contact the first portion of the source/drain contact.

BRIEF DESCRIPTION OF THE DRAWINGS

The inventive concepts will become more apparent in view of the attached drawings and accompanying detailed description.

FIG. 5 is a cross-sectional view taken along lines I-I', II-II', and III-III' of FIG. 4.

DETAILED DESCRIPTION OF THE EMBODIMENTS

Figure 1:
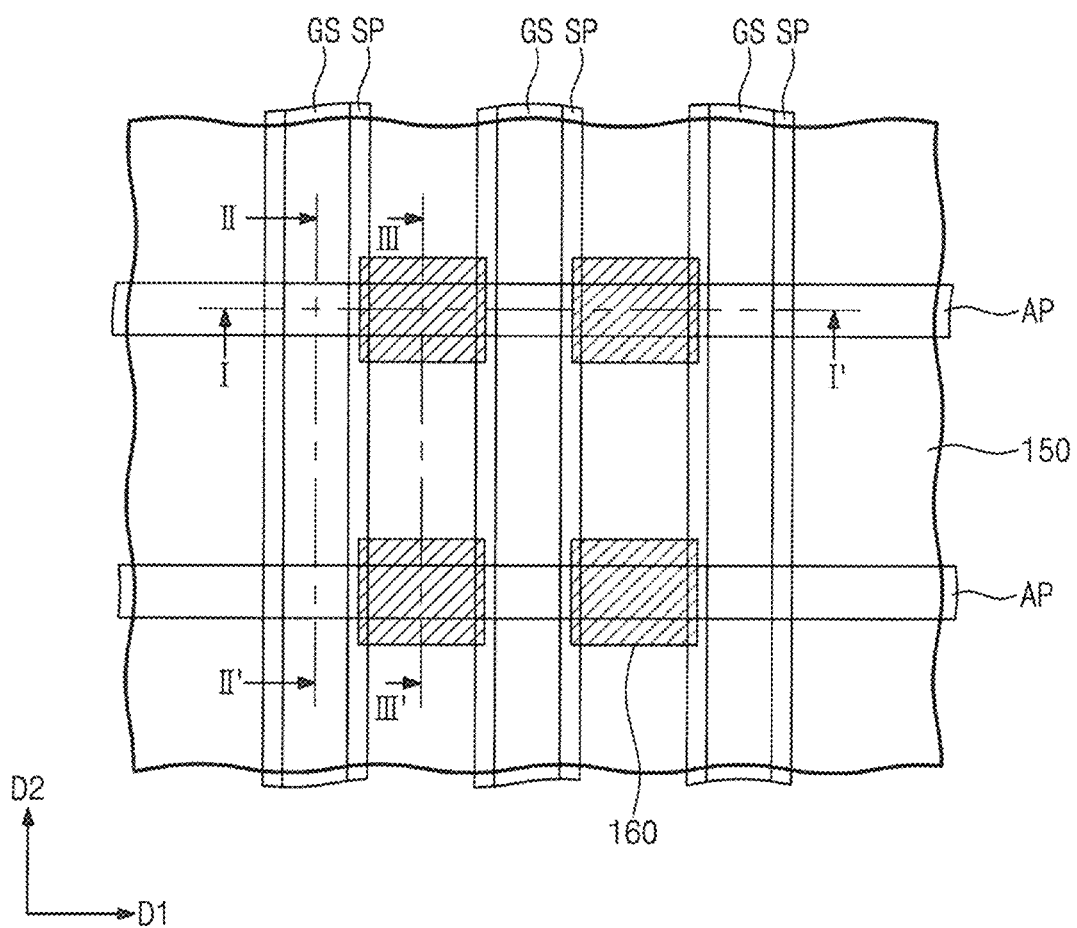
FIG. 1 is a plan view illustrating a semiconductor device according to embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 30A:
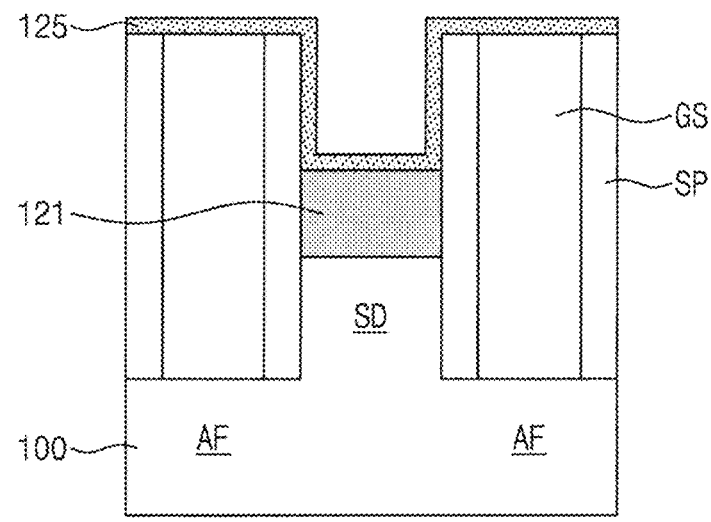
FIGS. 30A-30E are cross-sectional views illustrating semiconductor structures according to some embodiments.

Some embodiments of the inventive concepts form air gaps over source/drain regions before contacts are formed on the source drain regions. For example, FIG. 30A illustrates portions of a FINFET device structure during device fabrication. The structure includes active fins AF formed in a substrate 100, and a source/drain region SD between Gate structures GS. The gate structures GS and spacers SP are formed on the active fins AF. A sacrificial contact pattern 121 is formed on the source/drain region SD, and a gas-permeable capping layer 125 is formed over the structure including over the sacrificial contact pattern 121.

The sacrificial contact pattern 121 may include a material, such as a spin-on-hardmask (SOH) material, that includes hydrocarbons that are susceptible to undergoing a phase change from solid phase to gaseous phase when exposed to hydrogen radicals or oxygen radicals.

The gas-permeable capping layer 125 may include a silicon oxide layer or porous silicon oxy-hydrocarbon layer. When the gas-permeable capping layer 125 includes silicon oxide, the gas-permeable capping layer 125 may have a relatively small thickness, such as between 1 nm and 1.5 nm, so that it can retain its gas-permeable characteristic. When the gas-permeable capping layer 125 is formed of porous silicon oxy-hydrocarbon layer, it may have a greater thickness.

Figure 30B:
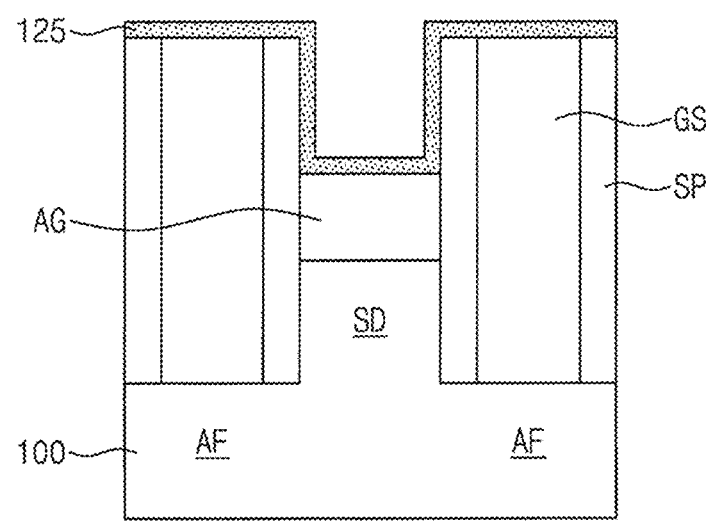

Referring to FIG. 30B, the sacrificial contact pattern 121 may be selectively removed, while keeping the gas-permeable capping layer 125 in place. In some embodiments, selective removal of the sacrificial contact pattern 121 may be accomplished using an ashing process. The ashing process may be performed at a temperature of 20 degrees Celsius to 400 degrees Celsius by supplying a process gas capable of generating hydrogen radicals or oxygen radicals to the surface of the structure. For example, the process gas may include at least one of ammonia ($NH_3$), hydrogen ($H_2$), dinitrogen monoxide ($N_2O$), oxygen ($O_2$), carbon dioxide ($CO_2$), or carbon monoxide (CO).

The hydrogen radicals or oxygen radicals generated in the ashing process may penetrate the gas-permeable capping layer 125 and react with hydrocarbon in the sacrificial contact pattern 121 to cause the phase of the sacrificial contact pattern 121 to be converted into a gaseous phase (e.g., methane ($CH_4$), carbon dioxide ($CO_2$), or carbon monoxide (CO)), which can escape through the gas-permeable capping layer 125. As a result, the sacrificial contact pattern 121 may be removed, leaving an air gap AG in the space from which the sacrificial contact pattern 121 was removed.

Figure 30C:
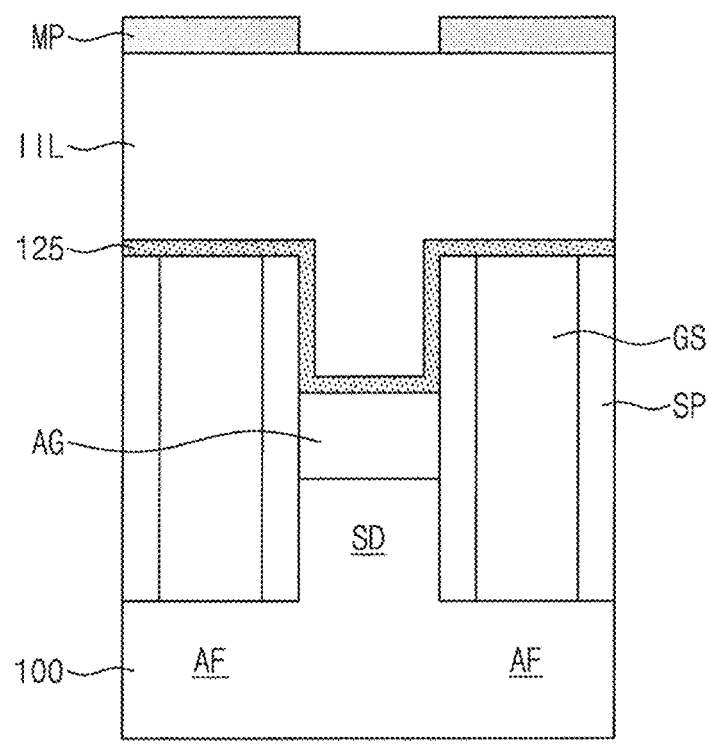

Referring to FIG. 30C, an insulating interlayer IIL is formed on the structure, and a mask pattern MP is formed on the insulating interlayer IIL. The mask pattern MP is patterned to expose a portion of the insulating interlayer IIL over the source/drain region SD.

Figure 30D:
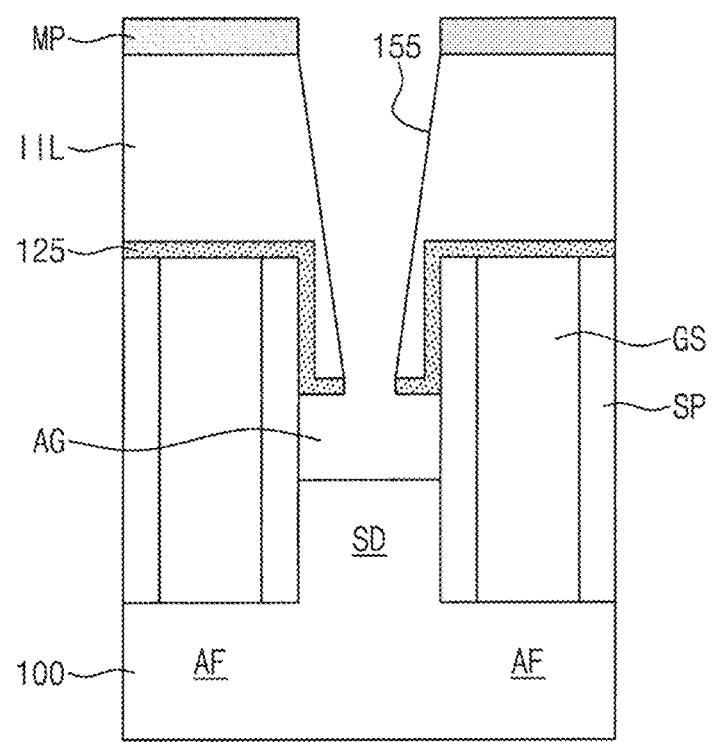

Referring to FIG. 30D, the insulating interlayer IIL and the gas-permeable capping layer 125 are etched using the mask pattern MP as an etch mask to form a contact hole 155 that exposes the air gap AG. The effective depth of the contact hole 155 is increased by the air gap AG, so that a contact hole through the insulating interlayer IIL may have a larger aspect ratio than may otherwise be possible. In addition, the etch process used to form the contact hole 155 may not have to etch into the source/drain region SD in order to form the contact hole 155, which can reduce damage that may otherwise occur to the source/drain region SD as a result of etching.

Figure 30E:
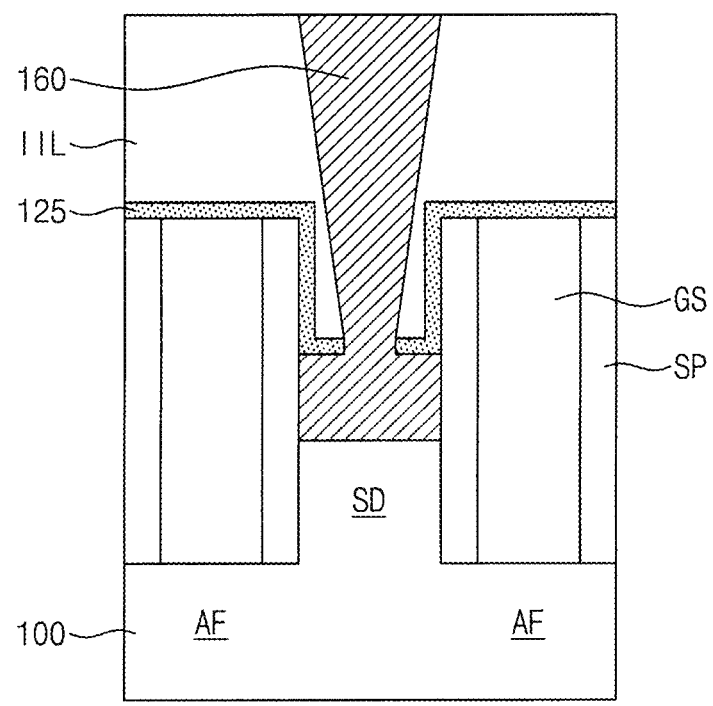

Referring to FIG. 30E, a source/drain contact 160 may then be formed in the contact hole 155 and the air gap AG to contact the source/drain region SD.

Figure 2:
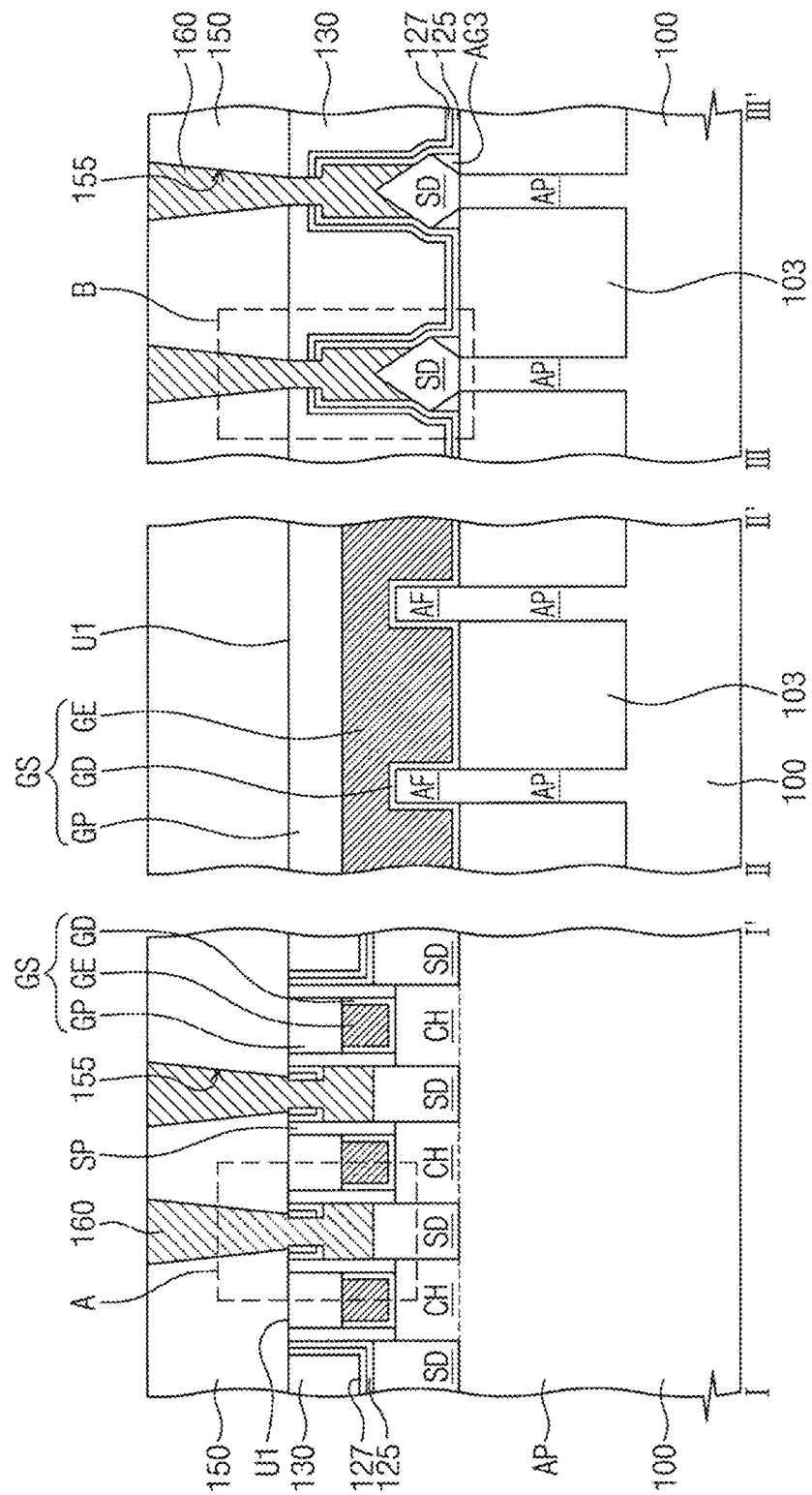
FIG. 2 is a cross-sectional view taken along lines I-I', II-II', and III-III' of FIG. 1.
Figure 3A:
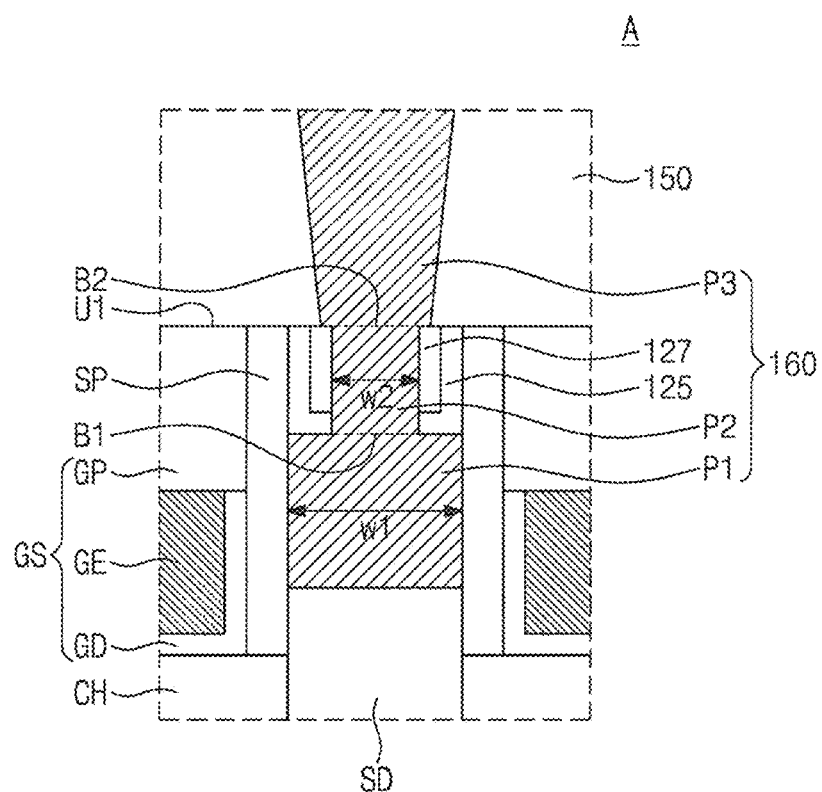
FIGS. 3A and 3C are enlarged views corresponding to a portion 'A' of FIG. 2.
Figure 3B:
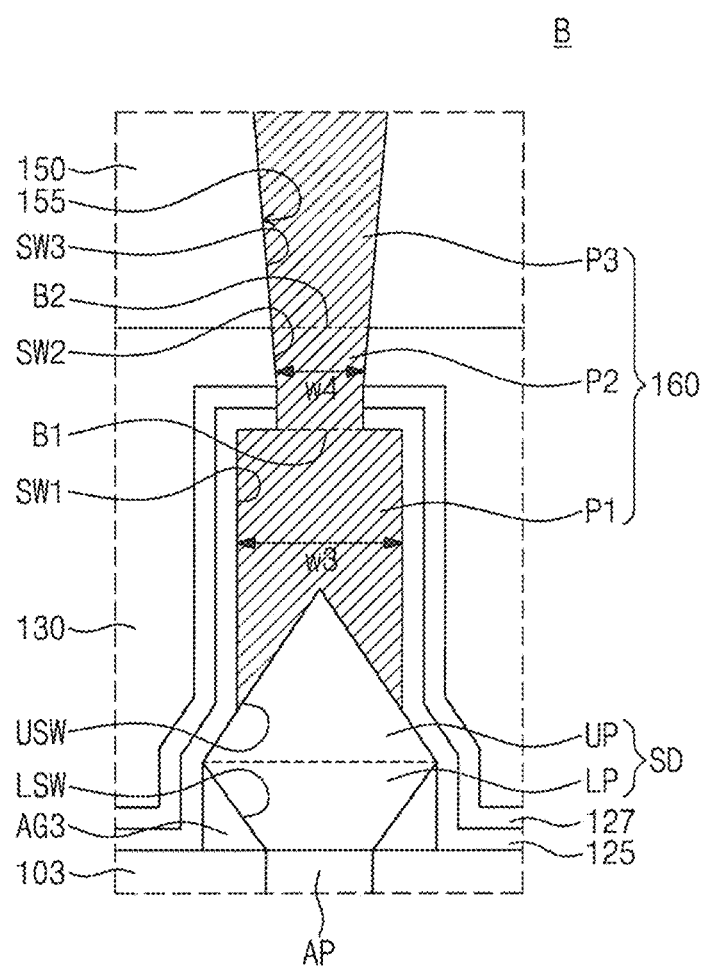
FIGS. 3B and 3D are enlarged views corresponding to a portion 'B' of FIG. 2.
Figure 3C:
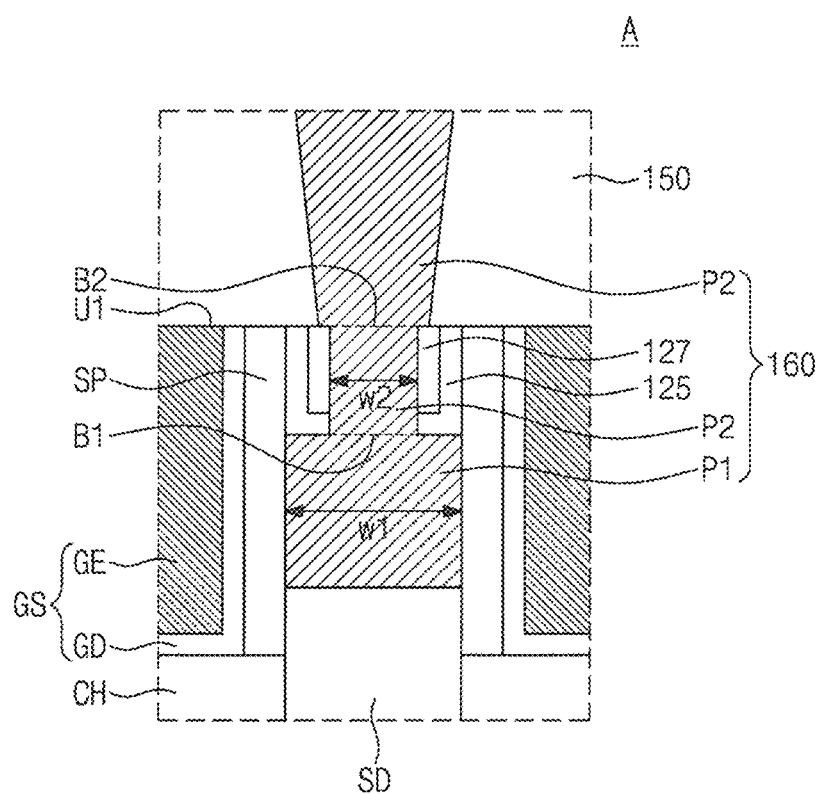
Figure 3D:
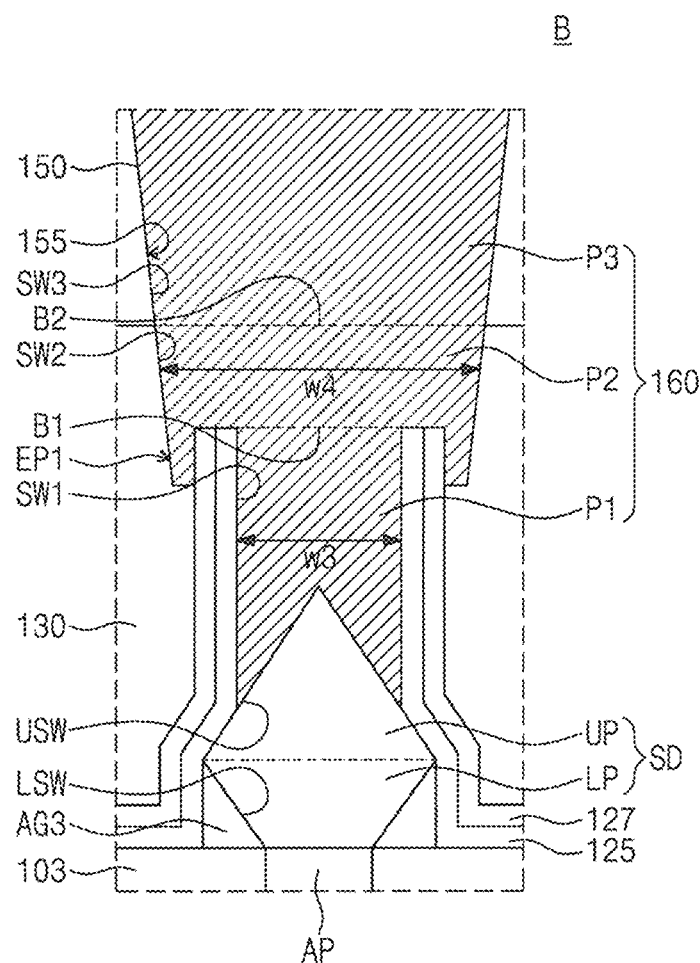

A more detailed explanation of a semiconductor device according to some embodiments will now be provided. FIG. 1 is a plan view illustrating a semiconductor device according to embodiments of the inventive concepts. FIG. 2 is a cross-sectional view taken along lines I-I', II-II', and III-III' of FIG. 1. FIGS. 3A and 3C are enlarged views corresponding to a portion 'A' of FIG. 2, and FIGS. 3B and 3D are enlarged views corresponding to a portion 'B' of FIG. 2.

Referring to FIGS. 1, 2, 3A, and 3B, a plurality of active patterns AP may be disposed on a substrate 100. The substrate 100 may be semiconductor substrate. For example, the substrate 100 may be a silicon substrate, a germanium substrate, or a silicon-on-insulator (SOI) substrate. Other substrate materials may be used as desired. The active patterns AP may extend in a first direction D1 and may be arranged along a second direction D2 that intersects the first direction D1. The active patterns AP may protrude from the substrate 100 in a direction that is perpendicular to a top surface of the substrate 100. For example, each of the active patterns AP may be formed in a portion of the substrate 100 or may include a portion of an epitaxial layer grown from the substrate 100.

Device isolation patterns 103 may be disposed on the substrate 100 on opposite sides of each of the active patterns AP. The device isolation patterns 103 may cover portions of sidewalls of the active patterns AP. In other words, upper portions of the active patterns AP may be exposed by the device isolation patterns 103. The upper portions of the active patterns AP, which are exposed by the device isolation patterns 103, may be defined as active fins AF. The device isolation patterns 103 may include at least one of an oxide (e.g., silicon oxide), a nitride (e.g., silicon nitride), and/or an oxynitride (e.g., silicon oxynitride). In the present embodiment, two active patterns AP are illustrated as an example. However, the inventive concepts are not limited thereto.

Gate structures GS may be disposed on the substrate 100. The gate structures GS may be arranged along the first direction D1 and may extend in the second direction D2 to cross over the active patterns AP. The gate structures GS may cover portions of the sidewalls of the active patterns AP. That is, the gate structures GS may cross over the active patterns AP and may cover top surfaces and sidewalls of the active fins AF. Hereinafter, the portions of the active fins AF that are locally disposed under the gate structures GS may be defined as channel regions CH. Gate spacers SP may be disposed on sidewalls of each of the gate structures GS. The gate spacers SP may extend along the sidewalls of the gate structures GS in the second direction D2. The gate spacers SP may include, for example, an insulating material such as silicon nitride and/or silicon oxynitride. In the present embodiment, three gate structures GS are illustrated as an example. However, the inventive concepts are not limited thereto.

According to some embodiments, each of the gate structures GS may include a gate electrode GE, a gate capping pattern GP on the gate electrode GE, and a gate dielectric pattern GD between the gate electrode GE and the gate spacers SP. The gate dielectric pattern GD may also be disposed between the gate electrode GE and the active fins AF and may extend horizontally from the active fins AF to at least partially cover top surfaces of the device isolation patterns 103. The gate dielectric pattern GD may extend along a bottom surface of the gate electrode GE. A height of a top surface U1 of the gate structure GS may be defined as a height of a top surface of the gate capping pattern GP.

The gate electrode GE may include a conductive material, such as a conductive metal nitride (e.g., titanium nitride or tantalum nitride) or a metal (e.g., aluminum or tungsten). The gate dielectric pattern GD may include a high-k dielectric layer. A high-k dielectric layer is a layer that has a dielectric constant larger than the dielectric constant of silicon dioxide. The gate dielectric pattern GD may include, for example, hafnium oxide, hafnium silicate, zirconium oxide, zirconium silicate, or other high-k dielectric material.

Source/drain regions SD may be disposed on opposite sides of each of the gate structures GS. In more detail, the source/drain regions SD may be disposed on the active patterns AP on opposite sides of each of the gate structures GS. In some embodiments, each of the source/drain regions SD may include a regrown epitaxial pattern that is formed using the active pattern AP disposed thereunder as a seed layer. If the source/drain regions SD constitute an N-type metal-oxide-semiconductor field effect transistor (NMOSFET), the source/drain regions SD may include a material capable of providing a tensile strain to the channel regions CH. For example, if the substrate 100 is the silicon substrate, the source/drain regions SD may include a silicon carbide (SiC) layer, which has a smaller lattice constant than silicon (Si), or a silicon layer that has the substantially same lattice constant as the substrate 100. If the source/drain regions SD constitute an P-type MOSFET (PMOSFET), the source/drain regions SD may include a material capable of providing a compressive strain to the channel regions CH. For example, if the substrate 100 is the silicon substrate, the source/drain regions SD may include a silicon-germanium (SiGe) layer that has a greater lattice constant than silicon (Si). Top surfaces of the channel regions CH may be higher than bottom surfaces of the source/drain regions SD in a cross-sectional view, and the each of the channel regions CH may be disposed between the source/drain regions SD in a plan view.

Each of the source/drain regions SD may include a lower portion LP being in contact with the active pattern AP disposed thereunder, and an upper portion UP vertically spaced apart from the active pattern AP with the lower portion LP interposed therebetween. The upper portion UP may extend from the lower portion LP. In a cross-sectional view taken along the second direction D2, a width of the lower portion LP may substantially increase as a distance from the substrate 100 increases, and a width of the upper portion UP may substantially decrease as a distance from the substrate 100 increases. In other words, each of the source/drain regions SD may have a negatively inclined lower sidewall LSW and a positively inclined upper sidewall USW. Thus, the upper portion UP of each of the source/drain regions SD may have a wedge shape. According to some embodiments, the uppermost ends of the source/drain regions SD may be higher than the top surfaces of the active fins AF (i.e., the top surfaces of the channel regions CH).

A capping layer 125 may be disposed on the substrate 100. The capping layer 125 may cover the top surfaces of the device isolation patterns 103 and may extend onto the source/drain regions SD and the sidewalls of the gate structures GS. In addition, the capping layer 125 may also extend onto lower sidewalls of a source/drain contact 160, as described in more detail below. For example, the capping layer 125 may include a silicon oxide layer or a porous silicon oxy-hydrocarbon layer, which is formed by an atomic layer deposition (ALD) process. The capping layer 125 may have a relatively small thickness when the capping layer 125 includes a silicon oxide layer, but the capping layer 125 may have a relatively thick thickness when the capping layer 125 includes a porous silicon oxy-hydrocarbon layer. For example, if the capping layer 125 includes a silicon oxide layer, the thickness of the capping layer 125 may be in a range of 1 nm to 1.5 nm. A contact etch stop layer 127 may be disposed on the capping layer 125. The contact etch stop layer 127 may extend along the capping layer 125 onto the source/drain regions SD, the sidewalls of the gate structures GS, and the lower sidewalls of the source/drain contact 160. The contact etch stop layer 127 may include the same material as the gate spacers SP. In other words, the contact etch stop layer 127 may include a material that has an etch selectivity with respect to a first interlayer insulating layer 130 to be described later. For example, the contact etch stop layer 127 may include a silicon nitride layer or a silicon oxynitride layer. The capping layer 125 and the contact etch stop layer 127 may be in contact with a portion of the sidewall of the source/drain contact 160. This will be described in more detail below.

The first interlayer insulating layer 130 may be disposed on the substrate 100 to cover the source/drain regions SD and the sidewalls of the gate structures GS. A top surface of the first interlayer insulating layer 130 may be substantially coplanar with the top surfaces of the gate structures GS. For example, the first interlayer insulating layer 130 may include at least one of a silicon oxide layer or low-k dielectric layers. A second interlayer insulating layer 150 may be disposed on the first interlayer insulating layer 130. The second interlayer insulating layer 150 may cover the top surfaces of the gate structures GS. For example, the second interlayer insulating layer 150 may include at least one of a silicon oxide layer, a silicon nitride layer, a silicon oxynitride layer, or low-k dielectric layers.

Source/drain contacts 160 may be disposed on the source/drain regions SD at one side or both sides of each of the gate structures GS. The source/drain contact 160 may penetrate the second interlayer insulating layer 150, the first interlayer insulating layer 130, the contact etch stop layer 127, and the capping layer 125 so as to be connected to the source/drain region SD. In the present embodiment, the source/drain contacts 160 disposed between the gate structures GS are illustrated as an example. However, the inventive concepts are not limited thereto.

The source/drain contact 160 may have a shape that is self-aligned with the contact etch stop layer 127 and the gate spacers SP. In other words, the source/drain contact 160 may be in partial contact with the contact etch stop layer 127 and the gate spacers SP. In more detail, the source/drain contact 160 may include a first portion P1 that is in contact with the source/drain region SD, a second portion P2 extending from the first portion P1 and disposed at a lower level than the top surface U1 of the gate structure GS, and a third portion P3 extending from the second portion P2 and disposed at a higher level than the top surface U1 of the gate structure GS. The first portion P1 may be in contact with the gate spacers SP, but the second portion P2 may not be in contact with the gate spacers SP. In the present embodiment, the first and second portions P1 and P2 may be disposed between the gate structures GS adjacent to each other and may correspond to a portion of the source/drain contact 160 disposed at a lower level than the top surface U1 of the gate structure GS. The third portion P3 may correspond to another portion of the source/drain contact 160 disposed at a higher level than the top surface U1 of the gate structure GS. In other words, a first boundary B1 between the first and second portions P1 and P2 may be lower than a second boundary B2 between the second and third portions P2 and P3. The height of the second boundary B2 may be defined as the height of the top surface U1 of the gate structure GS. In the present embodiment, the first boundary B1 may be higher than a top surface of the gate electrode GE.

According to embodiments of the inventive concepts, an insulating material may be disposed between the second portion P2 and the gate spacers SP, and thus, the second portion P2 may not be in contact with the gate spacers SP. As illustrated in FIG. 3A, the insulating material between the second portion P2 and the gate spacers SP may include a portion of the capping layer 125 and a portion of the contact etch stop layer 127. In more detail, between the second portion P2 and the gate spacers SP, the capping layer 125 may be adjacent to the gate spacers SP so as to be in contact with the gate spacers SP and the contact etch stop layer 127 may be disposed between the capping layer 125 and the second portion P2 so as to be in contact with the second portion P2. In addition, between the second portion P2 and the gate spacers SP, the capping layer 125 may have an extension extending into between the contact etch stop layer 127 and a top surface of the first portion PT. Thus, a first width w1 of the first portion P1 may be greater than a second width w2 of the second portion P2 when viewed from a cross-sectional view taken along the first direction D1. The first width w1 may correspond to a width, in the first direction D1, of the first portion P1 disposed between the uppermost end of the source/drain region SD and the first boundary B1. The second width w2 may correspond to a width, in the first direction D1, of the second portion P2 disposed between the first boundary B1 and the second boundary B2.

In addition, a width of the first portion P1 and a width of the second portion P2 may be variously realized when viewed from a cross-sectional view taken along the second direction D2. In some embodiments, as illustrated in FIG. 3B, a third width w3 of the first portion P1 in the second direction D2 may be greater than a fourth width w4 of the second portion P2 in the second direction D2. The third width w3 may correspond to a width, in the second direction D2, of the first portion P1 disposed between the uppermost end of the source/drain region SD and the first boundary B1. The fourth width w4 may correspond to a width, in the second direction D2, of the second portion P2 disposed between the first boundary B1 and the second boundary B2. In other embodiments, as illustrated in FIG. 3D, a third width w3 of the first portion P1 in the second direction D2 may be smaller than a fourth width w4 of the second portion P2 in the second direction D2. The embodiment of FIG. 3D will be described in more detail later.

According to embodiments of the inventive concepts, a profile of a first sidewall SW1 of the first portion P1 and a second sidewall SW2 of the second portion P2 adjacent thereto may be discontinuous when viewed from the cross-sectional view taken along the second direction D2. That is, the second sidewall SW2 of the second portion P2 may be offset from the first sidewall SW1 of the first portion P1. In other words, a width of the first portion P1 may be different from a width of the second portion P2 at the first boundary B1. On the contrary, a profile of the second sidewall SW2 of the second portion P2 and a third sidewall SW3 of the third portion P3 adjacent thereto may be continuous when viewed from the cross-sectional view taken along the second direction D2. In other words, a width of the second portion P2 may be substantially equal to a width of the third portion P3 at the second boundary B2. In some embodiments, the width of the third portion P3 may increase as a distance from the second boundary B2 increases. However, the inventive concepts are not limited thereto.

In some embodiments, the source/drain contact 160 may include a first conductive layer and a second conductive layer on the first conductive layer. The first conductive layer may include a barrier conductive layer. For example, the first conductive layer may include at least one of a titanium nitride layer, a tungsten nitride layer, or a tantalum nitride layer. The second conductive layer may include a metal layer. For example, the second conductive layer may include at least one of tungsten, titanium, or tantalum. In addition, the source/drain contact 160 may further include a metal silicide layer disposed between the first conductive layer and the source/drain region SD. For example, the metal silicide layer may include at least one of titanium silicide, tantalum silicide, or tungsten silicide. In other embodiments, the source/drain contact 160 may include a doped semiconductor material.

Meanwhile, the capping layer 125 may be in contact with the first sidewalls SW1 of the first portion P1 and may extend onto the top surface of the first portion P1. The capping layer 125 disposed on the top surface of the first portion P1 may be in contact with the second sidewalls SW2 of the second portion P2. The contact etch stop layer 127 may also extend onto the first sidewalls SW1 and the top surface of the first portion P1. The contact etch stop layer 127 disposed on the top surface of the first portion P1 may also be in contact with the second sidewalls SW2 of the second portion P2. According to some embodiments, air gaps AG3 may exist between the capping layer 125 and the lower sidewalls LSW of the source/drain regions SD. The air gaps AG3 may be substantially empty spaces in which a solid material is not provided.

Even though not shown in the drawings, interconnections connected to the source/drain contacts 160 may be disposed on the second interlayer insulating layer 150. The interconnections may be electrically connected to the source/drain regions SD through the source/drain contacts 160. The interconnections may include a conductive material.

Hereinafter, modified embodiments of the semiconductor device according to embodiments of FIGS. 1, 2, 3A and 3B will be described with reference to FIGS. 3C and 3D. FIG. 3C illustrates a gate structure of which a shape is different from that of the gate structure GS illustrated in FIG. 3A, and FIG. 3D illustrates a source/drain contact of which a shape is different from that of the source/drain contact 160 illustrated in FIG. 3B.

Referring to FIG. 3C, a gate structure GS may not include the gate capping pattern GP disposed on a gate electrode GE, unlike FIG. 3A. In other words, the gate structure GS may include the gate dielectric pattern GD and the gate electrode GE. Here, a height of a top surface U1 of the gate structure GS may be defined as a height of a top surface of the gate electrode GE. Thus, the height of the second boundary B2 may be the substantially same as the height of the top surface of the gate electrode GE. As a result, the first boundary B1 may be lower than the top surface of the gate electrode GE in the present embodiment.

Referring to FIG. 3D, as described above, the third width w3 of the first portion P1 of the source/drain contact 160 may be smaller than the fourth width w4 of the second portion P2 when viewed from the cross-sectional view taken along the second direction D2. Here, the third width w3 may correspond to a width, in the second direction D2, of the first portion P1 disposed between the uppermost end of the source/drain region SD and the first boundary B1, and the fourth width w4 may correspond to a width, in the second direction D2, of the second portion P2 disposed between the first boundary B1 and the second boundary B2. Even though the third width w3 of the first portion P1 is smaller than the fourth width w4 of the second portion P2, a sidewall profile of the first and second portions P1 and P2 may be similar to the sidewall profile of the first and second portions P1 and P2 described with reference to FIG. 3B. As described above, a profile of a first sidewall SW1 of the first portion P1 and a second sidewall SW2 of the second portion P2 adjacent thereto may be discontinuous when viewed from the cross-sectional view taken along the second direction D2. In other words, a width of the first portion P1 may be different from a width of the second portion P2 at the first boundary B1. On the contrary, a profile of the second sidewall SW2 of the second portion P2 and a third sidewall SW3 of the third portion P3 adjacent thereto may be continuous when viewed from the cross-sectional view taken along the second direction D2. In other words, a width of the second portion P2 may be substantially equal to a width of the third portion P3 at the second boundary B2. In some embodiments, the width of the third portion P3 may increase as a distance from the second boundary B2 increases. In addition, the second portion P2 may include a first extension EP1 disposed at a lower level than the first boundary B1. The first extension EP1 may be spaced apart from the first sidewalls SW1 of the first portion P1.

Meanwhile, the capping layer 125 may extend onto the first sidewalls of the first portion P1 and may be in contact with the first sidewalls SW1. The contact etch stop layer 127 may be in contact with the capping layer 125 and may extend onto the first sidewalls SW1 of the first portion P1. The capping layer 125 and the contact etch stop layer 127 disposed on the first sidewalls SW1 may extend into between the first portion P1 and the first extension EP1 so as to be disposed therebetween.

Hereinafter, a semiconductor device according to embodiments of the inventive concepts will be described with reference to FIGS. 4, 5, and 6A to 6C.

Figure 4:
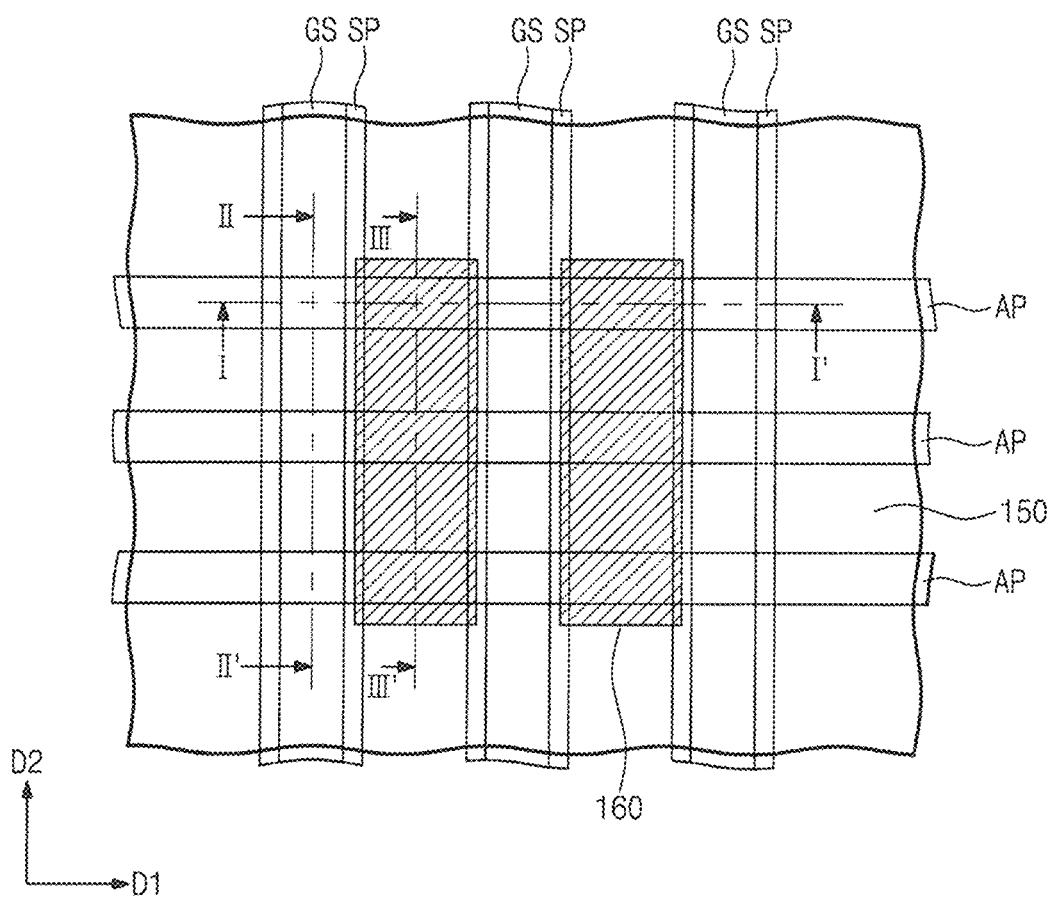
FIG. 4 is a plan view illustrating a semiconductor device according to embodiments of the inventive concepts.
Figure 6A:
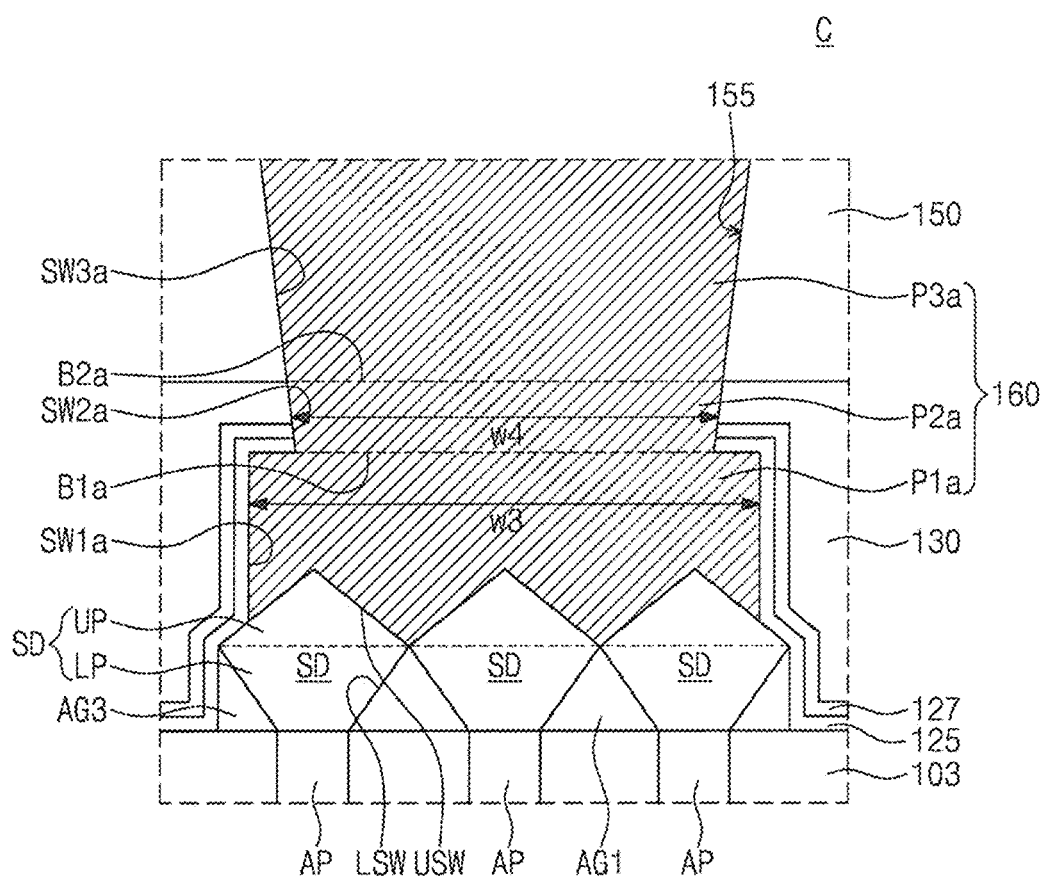
FIGS. 6A, 6B, and 6C are enlarged views corresponding to a portion 'C' of FIG. 5.
Figure 6B:
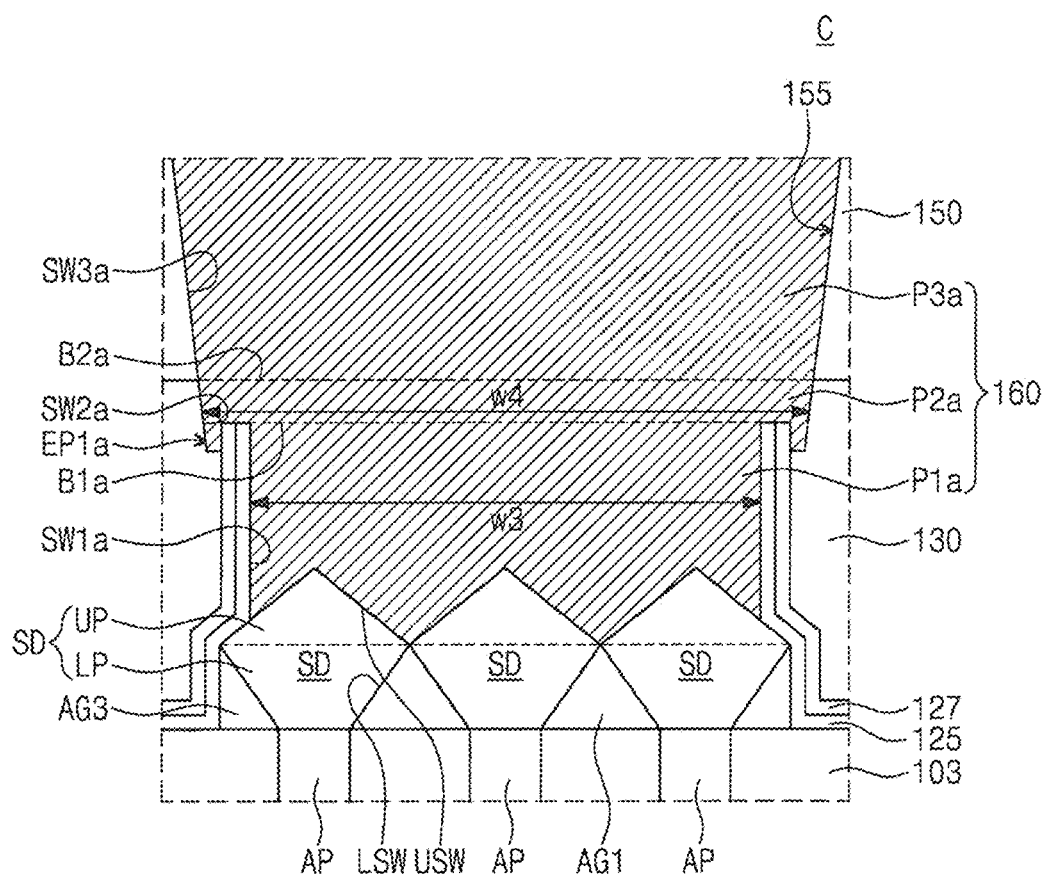
Figure 6C:
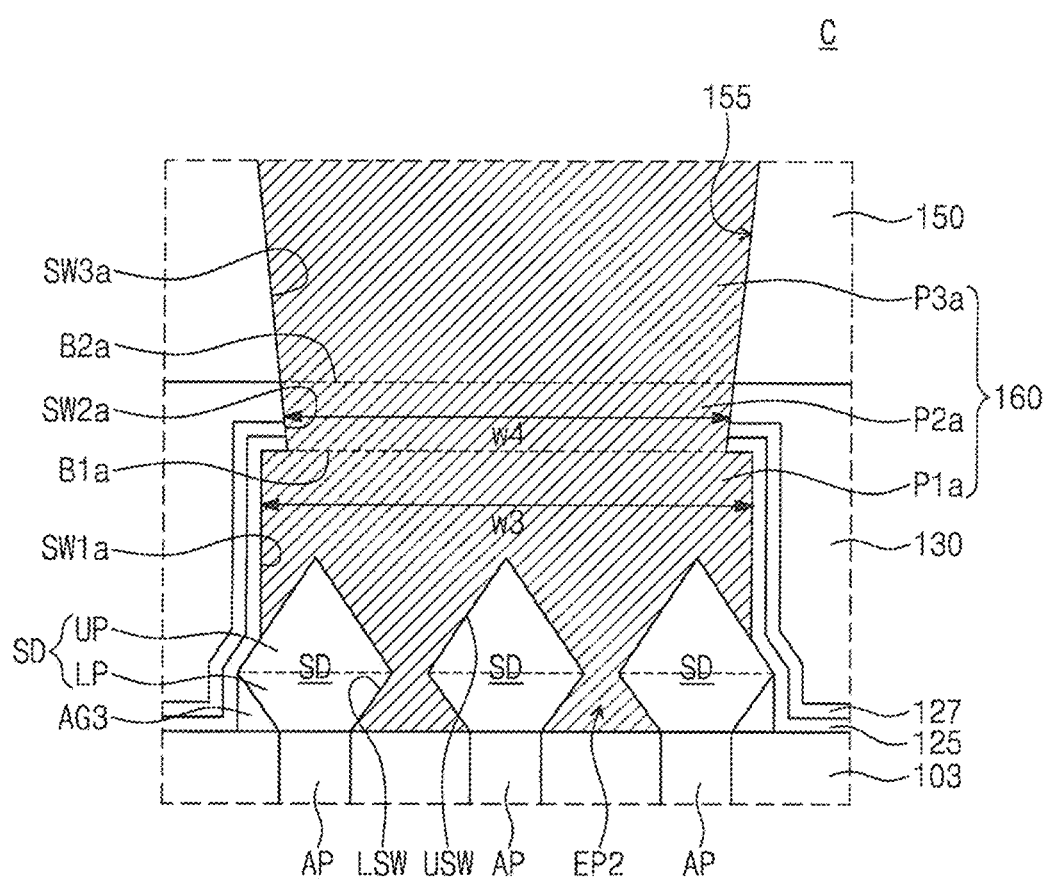

FIG. 4 is a plan view illustrating a semiconductor device according to embodiments of the inventive concepts. FIG. 5 is a cross-sectional view taken along lines I-I', II-II', and III-III' of FIG. 4. FIGS. 6A, 6B, and 6C are enlarged views corresponding to a portion 'C' of FIG. 5. Hereinafter, differences between the present embodiment and embodiments of FIGS. 1, 2, and 3A to 3D will be mainly described for the purpose of ease and convenience in explanation.

Referring to FIGS. 4, 5, and 6A, active patterns AP may protrude from a top surface of a substrate 100. The active patterns AP may extend in a first direction D1 and may be arranged along a second direction D2. According to some embodiments, distances between the active patterns AP may be substantially equal to each other. However, the inventive concepts are not limited thereto. According to other embodiments, the distances between the active patterns AP may be different from each other.

Gate structures GS may be disposed on the substrate 100 to cross over the active patterns AP. Source/drain regions SD may be disposed on the active patterns AP at both sides of each of the gate structures GS. In some embodiments, sidewalls of the source/drain regions SD adjacent to each other may be in contact with each other. In this case, an air gap AG1 may exist under the sidewalls of the source/drain regions SD that are adjacent to and in contact with each other. The air gap AG1 may be a substantially empty space in which a solid material is not provided.

A source/drain contact 160 may be disposed on the source/drain regions SD at a side and/or both sides of each of the gate structures GS. The source/drain contact 160 may be connected in common to a plurality of the source/drain regions SD disposed thereunder. The source/drain contact 160 may cross over a plurality of the active patterns AP when viewed from a plan view. In more detail, the source/drain contact 160 may include a first portion P1a that is in contact with the plurality of source/drain regions SD, a second portion P2a extending from the first portion P1a and disposed at a lower level than a top surface U1 of the gate structure GS, and a third portion P3a extending from the second portion P2a and disposed at a higher level than the top surface U1 of the gate structure GS. At this time, the first portion P1a may be in contact with gate spacers SP, and the second portions P2a may not be in contact with the gate spacers SP. In the present embodiment, the first and second portions P1a and P2a may be a portion of the source/drain contact 160 which is disposed between the gate structures GS adjacent to each other and is disposed at a lower level than the top surface U1 of the gate structure GS, and the third portion P3a may be another portion of the source/drain contact 160 which is disposed at a higher level than the top surface U1 of the gate structure GS. In other words, a height of a first boundary B1a between the first and second portions P1a and P2a may be lower than that of a second boundary B2a between the second and third portions P2a and P3a. The height of the second boundary B2a may be defined as the height of the top surface U1 of the gate structure GS. In the present embodiment, the first boundary B1a may be higher than a top surface of the gate electrode GE.

As described in embodiments of FIGS. 1, 2, 3A and 3B, a portion of the capping layer 125 and a portion of the contact etch stop layer 127 may be disposed between the second portion P2a and the gate spacers SP. In more detail, between the second portion P2a and the gate spacers SP, the capping layer 125 may be in contact with the gate spacers SP and the contact etch stop layer 127 may be disposed between the capping layer 125 and the second portion P2a so as to be in contact with the second portion P2a. In addition, between the second portion P2a and the gate spacers SP, the capping layer 125 may have a portion extending into between the contact etch stop layer 127 and a top surface of the first portion P1a. Thus, a width w1 of the first portion P1a may be greater than a second width w2 of the second portion P2a when viewed from a cross-sectional view taken along the first direction D1. The first width w1 may correspond to a width, in the first direction D1, of the first portion P1a disposed between the uppermost end of the source/drain region SD and the first boundary B1a. The second width w2 may correspond to a width, in the first direction D1, of the second portion P2a disposed between the first boundary B1a and the second boundary B2a.

According to some embodiments, a third width w3 of the first portion P1a in the second direction D2 may be greater than a fourth width w4 of the second portion P2a in the second direction D2, as illustrated in FIG. 6A. The third width w3 may correspond to a width, in the second direction D2, of the first portion P1a disposed between the uppermost end of the source/drain region SD and the first boundary B1a. The fourth width w4 may correspond to a width, in the second direction D2, of the second portion P2a disposed between the first boundary B1a and the second boundary B2a. In addition, a profile of a first sidewall SW1a of the first portion P1a and a second sidewall SW2a of the second portion P2a adjacent thereto may be discontinuous when viewed from a cross-sectional view taken along the second direction D2. In other words, a width of the first portion P1a may be different from a width of the second portion P2a at the first boundary B1a. On the contrary, a profile of the second sidewall SW2a of the second portion P2a and a third sidewall SW3a of the third portion P3a adjacent thereto may be continuous when viewed from the cross-sectional view taken along the second direction D2. In other words, a width of the second portion P2a may be substantially equal to a width of the third portion P3a at the second boundary B2a. In some embodiments, the width of the third portion P3a may increase as a distance from the second boundary B2a increases. However, the inventive concepts are not limited thereto.

Meanwhile, the capping layer 125 may be in contact with the first sidewalls SW1a of the first portion P1a and may extend onto the top surface of the first portion P1a. The capping layer 125 on the top surface of the first portion P1a may be in contact with the second sidewalls SW2a of the second portion P2a. The contact etch stop layer 127 may also extend onto the first sidewalls SW1a and the top surface of the first portion P1a. The contact etch stop layer 127 on the top surface of the first portion P1a may also be in contact with the second sidewalls SW2a of the second portion P2a. According to some embodiments, air gaps AG3 may exist between the capping layer 125 and the lower sidewalls LSW of the source/drain regions SD that are adjacent to the capping layer 125. Other elements of the semiconductor device according to the present embodiment may be the same as or similar to corresponding elements of the semiconductor device of embodiments of FIGS. 1, 2, 3A and 3B.

Even though not shown in the drawings, interconnections connected to the source/drain contacts 160 may be disposed on the second interlayer insulating layer 150. The interconnections may be electrically connected to the source/drain regions SD through the source/drain contacts 160. The interconnections may include a conductive material.

Modified embodiments of the semiconductor device according to embodiments of FIGS. 4, 5 and 6A will be described with reference to FIGS. 6B and 6C. FIGS. 6B and 6C illustrate source/drain contacts of which shapes are different from that of the source/drain contact illustrated in FIG. 6A.

Referring to FIG. 6B, a third width w3 of the first portion P1a of the source/drain contact 160 may be smaller than a fourth width w4 of the second portion P2a of the source/drain contact 160 when viewed from a cross-sectional view taken along the second direction D2. The third width w3 may correspond to a width, in the second direction D2, of the first portion P1a disposed between the uppermost end of the source/drain region SD and the first boundary B1a. The fourth width w4 may correspond to a width, in the second direction D2, of the second portion P2a disposed between the first boundary B1a and the second boundary B2a. In addition, a profile of a first sidewall SW1a of the first portion P1a and a second sidewall SW2a of the second portion P2a adjacent thereto may be discontinuous when viewed from a cross-sectional view taken along the second direction D2. In other words, a width of the first portion P1a may be different from a width of the second portion P2a at the first boundary B1a. On the contrary, a profile of the second sidewall SW2a of the second portion P2a and a third sidewall SW3a of the third portion P3a adjacent thereto may be continuous when viewed from a cross-sectional view taken along the second direction D2. In other words, a width of the second portion P2a may be substantially equal to a width of the third portion P3a at the second boundary B2a. In some embodiments, the width of the third portion P3a may increase as a distance from the second boundary B2a increases. Furthermore, the second portion P2a may include an extension EP1a disposed at a lower level than the first boundary B1a. The first extension EP1a may be spaced apart from the first sidewalls SW1a of the first portion P1a.

Meanwhile, the capping layer 125 may extend onto the first sidewalls SW1a of the first portion P1a so as to be in contact with the first sidewalls SW1a. The contact etch stop layer 127 may be in contact with the capping layer 125 and may extend onto the first sidewalls SW1a of the first portion P1a with the capping layer 125 interposed therebetween. The capping layer 125 and the contact etch stop layer 127 disposed on the first sidewalls SW1a may extend into between the first portion P1a and the first extension EP1a so as to be disposed therebetween.

Referring to FIG. 6C, a source/drain contact 160 may be connected in common to a plurality of source/drain regions SD disposed thereunder, as described with reference to FIG. 6A. In other word, the source/drain contact 160 may be in contact with upper sidewalls USW of the plurality of source/drain regions SD disposed thereunder. Here, the plurality of source/drain regions SD being in contact with the source/drain contact 160 may be spaced apart from each other, unlike FIG. 6A. Thus, the source/drain contact 160 may extend into between the upper sidewalls USW of the source/drain regions SD so as to be in contact with lower sidewalls LSW of the source/drain regions SD. In other word, the first portion P1a of the source/drain contact 160 may include a second extension EP2 that extends under the upper sidewalls USW of the source/drain regions SD adjacent to each other so as to be in contact with the lower sidewalls LSW of the source/drain regions SD.

Even though not shown in the drawings, the modified embodiment of the gate structure illustrated in FIG. 3C may be applied to the semiconductor device according to embodiments of FIGS. 4, 5 and 6A.

Hereinafter, methods of forming the semiconductor device according to embodiments of FIGS. 4, 5 and 6A will be described with reference to FIGS. 7 to 21.

FIGS. 7 to 21 are cross-sectional views corresponding to the lines I-I', II-II', and III-III' of FIG. 4 to illustrate method of forming a semiconductor device according to embodiments of FIGS. 4, 5 and 6A of the inventive concepts.

Figure 7:
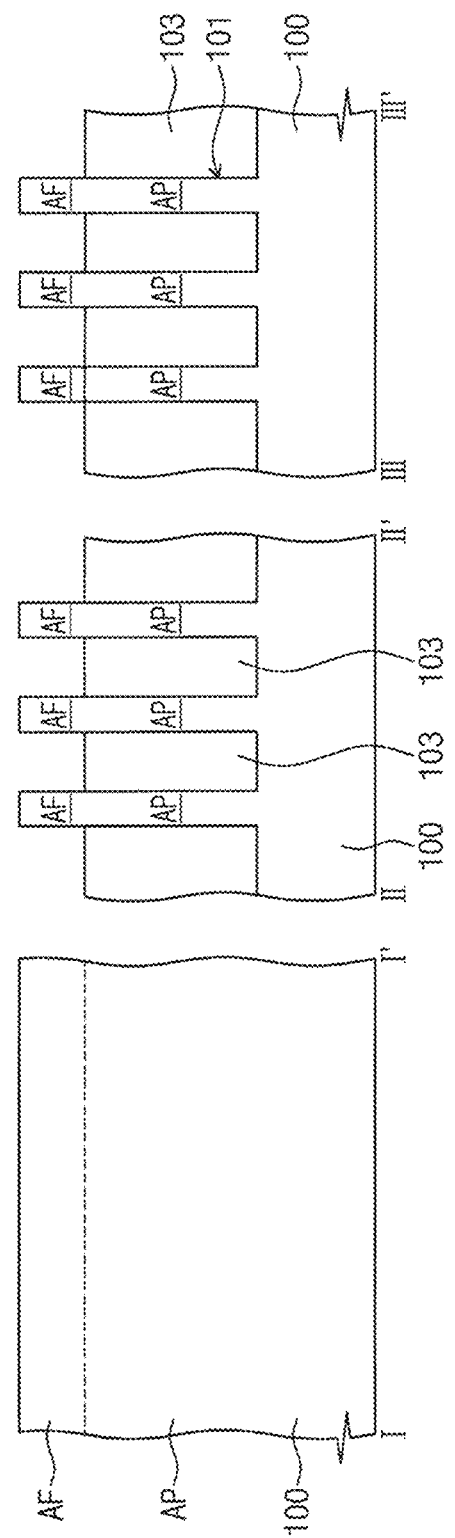
FIGS. 7 to 21 are cross-sectional views corresponding to the lines I-I', II-II', and III-III' of FIG. 4 to illustrate a method for manufacturing the semiconductor device according to embodiments of the inventive concepts.

Referring to FIG. 7, trenches 101 may be formed in a substrate 100 to define active patterns AP. According to an embodiment, the trenches 101 may be formed by patterning the substrate 100. According to another embodiment, an epitaxial layer may be formed on the substrate 100, and then, the epitaxial layer may be patterned to form the trenches 101. At this time, the epitaxial layer may include a plurality of epitaxial layers having different lattice constants from each other. The active patterns AP may extend in a first direction D1 and may be arranged along a second direction D2 intersecting the first direction D1. In some embodiments, the active patterns AP may be arranged at substantially equal intervals. However, the inventive concepts are not limited thereto. In other embodiments, the active patterns AP may be arranged at different intervals. The substrate 100 may be a semiconductor substrate. For example, the substrate 100 may be a silicon substrate, a germanium substrate, or a SOI substrate.

Device isolation patterns 103 may be formed in the trenches 101. The device isolation patterns 103 may be formed to expose upper portions of the active patterns AP. The upper portions of the active patterns AP, which are exposed by the device isolation patterns 103, may be defined as active fins AF. The device isolation patterns 103 may include at least one of an oxide (e.g., silicon oxide), a nitride (e.g., silicon nitride), or an oxynitride (e.g., silicon oxynitride).

Figure 8:
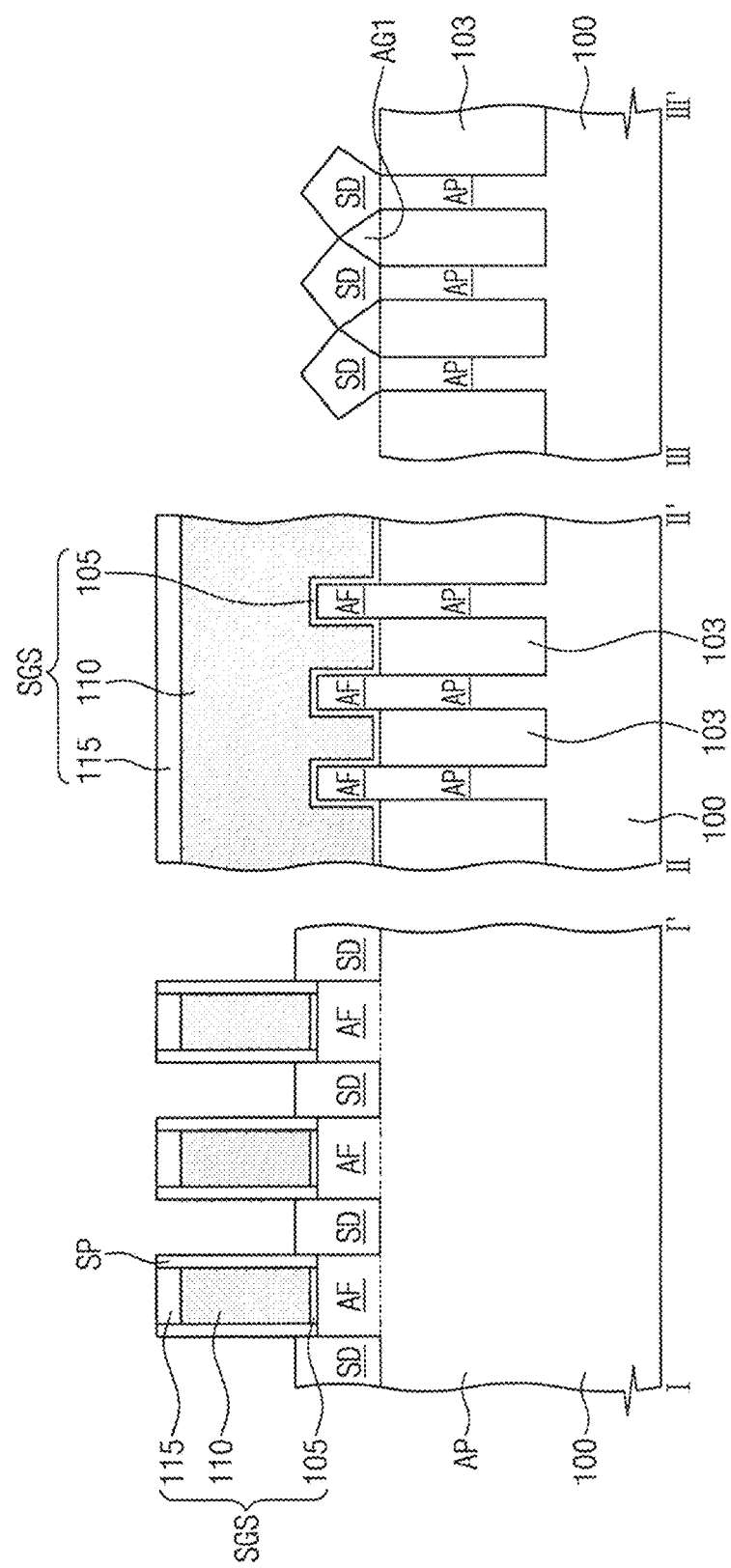

Referring to FIG. 8, sacrificial gate structures SOS may be formed on the substrate 100. The sacrificial gate structures SOS may be arranged along the first direction D1 and may extend in the second direction D2 to cross over the active fins AF. Each of the sacrificial gate structures SGS may include an etch stop pattern 105, a sacrificial gate pattern 110, and a gate mask pattern 115 which are sequentially stacked on the substrate 100. The etch stop pattern 105 and the sacrificial gate pattern 110 may cover top surfaces and sidewalls of the active fins AF and may extend onto top surfaces of the device isolation patterns 103. The gate mask pattern 115 may be disposed on a top surface of the sacrificial gate pattern 110 and may extend along the top surface of the sacrificial gate pattern 110. An etch stop layer, a sacrificial gate layer, and a gate mask layer may be sequentially formed on the substrate 100, and then, they may be patterned to form the sacrificial gate structures SGS. The etch stop layer may include, for example, silicon oxide. The sacrificial gate layer may include a material having an etch selectivity with respect to the etch stop layer. For example, the sacrificial gate layer may include poly-silicon. The sacrificial gate layer may be formed by a chemical vapor deposition (CVD) process, a physical vapor deposition (PVD) process, or an atomic layer deposition (ALD) process. The gate mask layer may include a silicon nitride layer and/or a silicon oxynitride layer.

Next, gate spacers SP may be formed on sidewalls of the sacrificial gate structures SOS. According to an embodiment, a gate spacer layer may be formed on the substrate 100 to conformally cover the sacrificial gate structures SGS, and the gate spacer layer may be etched until top surfaces of the sacrificial gate structures SGS are exposed, thereby forming the gate spacers SP. For example, the gate spacer layer may include a silicon nitride layer and/or a silicon oxynitride layer. The gate spacer layer may be formed by a CVD process or an ALD process.

Source/drain regions SD may be formed on the active patterns AP at both sides of each of the sacrificial gate structures SGS. In some embodiments, upper portions of the active patterns AP disposed at both sides of each of the sacrificial gate structures SGS may be recessed before the formation of the source/drain regions SD, and the source/drain regions SD may be formed on the recessed active patterns AP. However, the inventive concepts are not limited thereto. Recessing the upper portions of the active patterns AP may include forming a mask pattern (not shown) on the substrate 100 and performing an etching process using the mask pattern as an etch mask. In some embodiments, each of the source/drain regions SD may be formed by performing a selective epitaxial growth (SEG) process using the active pattern AP disposed thereunder as a seed layer. If the source/drain regions SD constitute an NMOSFET, the source/drain regions SD may be formed to provide a tensile strain to the active fins AF. For example, if the substrate 100 is a silicon substrate, the source/drain regions SD may be formed of a silicon carbide (SiC) layer having a lattice constant smaller than that of silicon (Si), or a silicon (Si) layer having a lattice constant substantially equal to that of silicon (Si). If the source/drain regions SD constitute a PMOSFET, the source/drain regions SD may be formed to provide a compressive strain to the active fins AF. For example, if the substrate 100 is a silicon substrate, the source/drain regions SD may be formed of a silicon-germanium (SiGe) layer having a lattice constant greater than that of silicon (Si). The source/drain regions SD may be doped with dopants during or after the SEG process. Since the source/drain regions SD are formed by the SEG process, the source/drain regions SD may have negatively inclined lower sidewalls and positively inclined upper sidewalls. In other words, upper portions of the source/drain regions SD may have a wedge shape. In some embodiments, uppermost ends of the source/drain regions SD may be higher than top surfaces of the active fins AF.

The spacers SP define source/drain contact holes adjacent to the sacrificial gate structures SGS. The source/drain contact holes have a first aspect ratio.

In some embodiments, the sidewalls of the source/drain regions SD adjacent to each other may be in contact with each other, as illustrated in FIG. 8. This may be realized by adjusting a growth rate of the source/drain regions SD during the SEG process when distances between the active patterns AP are narrow. In this case, first air gaps AG1 may be formed under the sidewalls of the source/drain regions SD being in contact with each other between the sacrificial gate structures SGS. In other words, the first air gaps AG1 may be formed between the lower sidewalls of the source/drain regions SD being in contact with each other between the sacrificial gate structures SGS. Alternatively, the sidewalls of the source/drain regions SD may not be in contact with each other, unlike FIG. 8.

Figure 9:
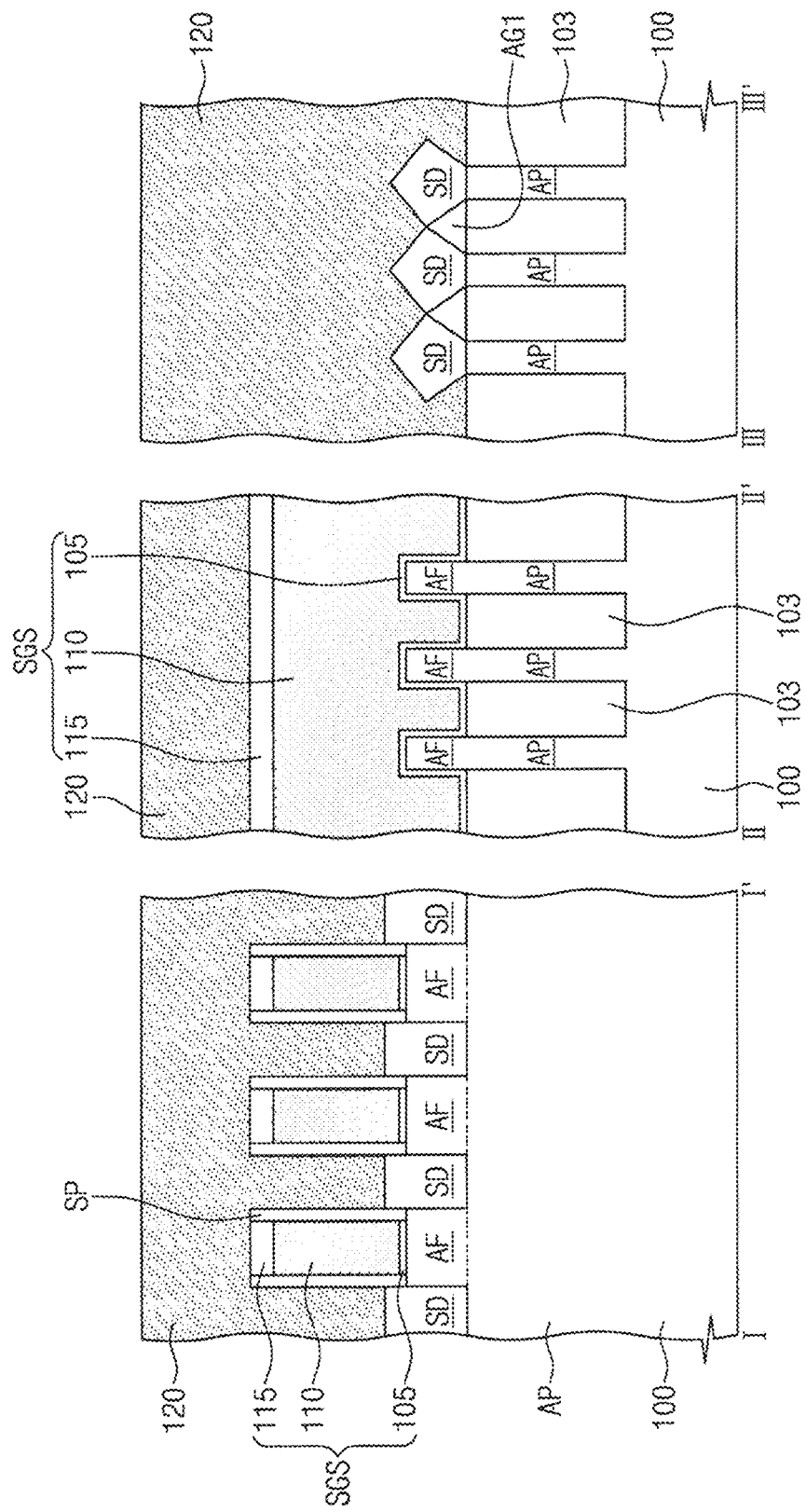

Referring to FIG. 9, a sacrificial layer 120 may be formed on the substrate 100 having the source/drain regions SD. The sacrificial layer 120 may fill spaces between the sacrificial gate structures SGS and may cover the top surfaces of the sacrificial gate structures SGS, i.e., the sacrificial layer 120 may fill the source/drain contact holes. The first aspect ratio of the source/drain contact holes is is not too large, so that a good gap-filling characteristic can be obtained in the source/drain contact holes. The sacrificial layer 120 may be formed of a hydrocarbon-based insulating layer. For example, the sacrificial layer 120 may be formed of a spin-on-hardmask (SOH) layer.

Figure 10:
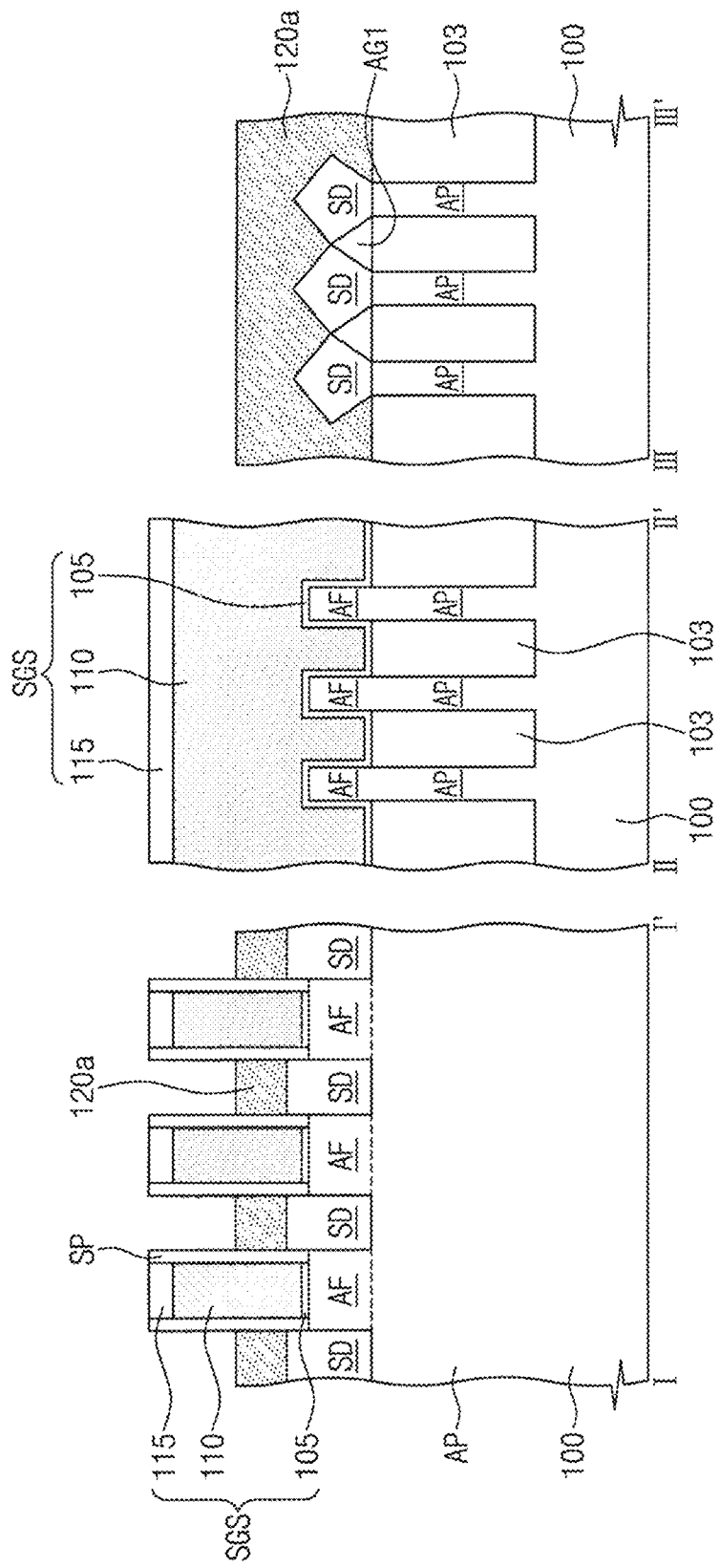

Referring to FIG. 10, the sacrificial layer 120 may be recessed to provide a recessed sacrificial layer 120a. The recessed sacrificial layer 120a may expose sidewalls of upper portions of the sacrificial gate structures SGS. In more detail, a top surface of the recessed sacrificial layer 120a may be lower than top surfaces of the sacrificial gate patterns 110 and may be higher than the uppermost ends of the source/drain regions SD. In an embodiment, recessing the sacrificial layer 120 may include performing an anisotropic etching process capable of selectively removing the sacrificial layer 120.

Figure 11:
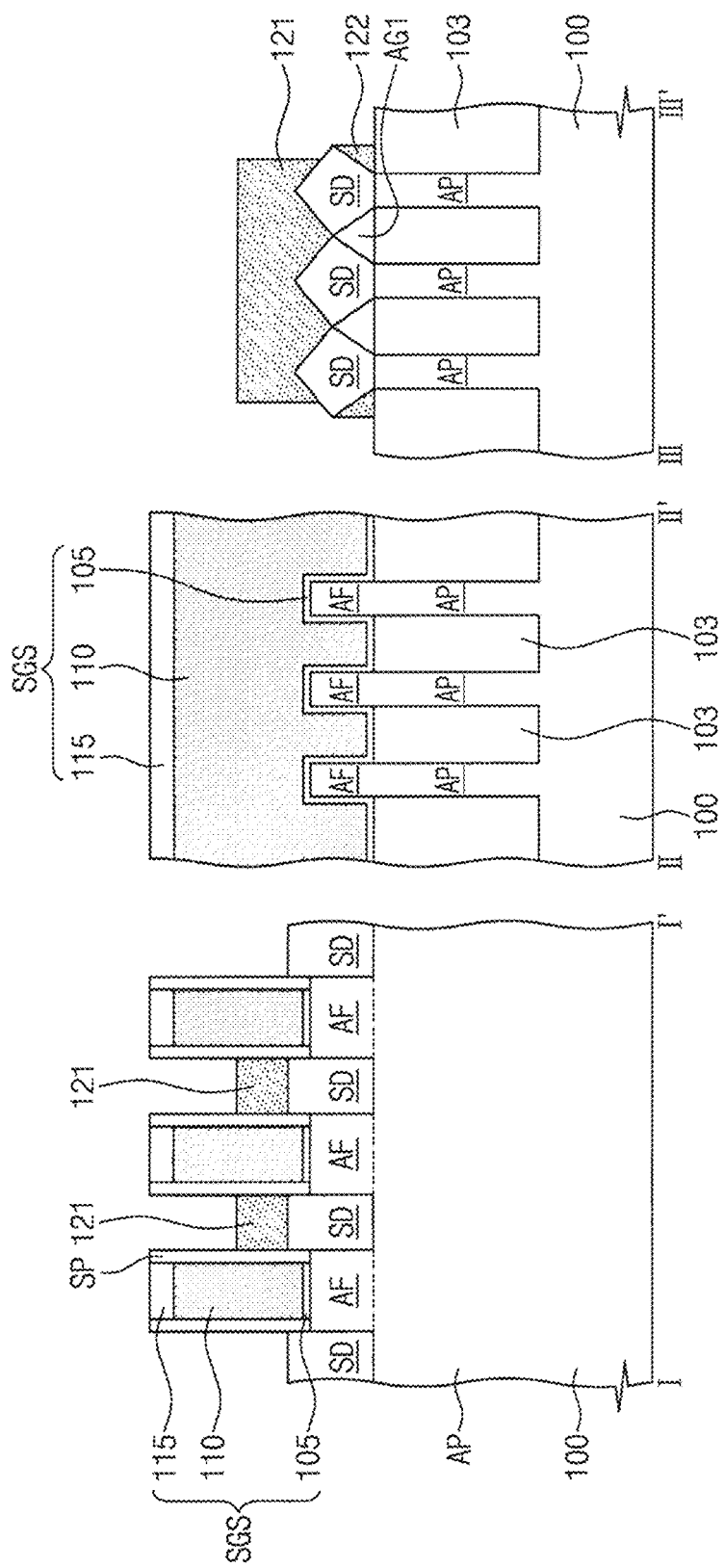

Referring to FIG. 11, the recessed sacrificial layer 120a may be patterned to form sacrificial contact patterns 121. In the present embodiment, each of the sacrificial contact patterns 121 may be disposed on a plurality of the source/drain regions SD to cover the upper sidewalls of the source/drain regions SD in common. However, the inventive concepts are not limited thereto. Unlike FIG. 11, the sacrificial contact patterns 121 may be locally disposed on the source/drain regions SD, respectively. In an embodiment, a mask pattern (not shown) may be formed on the substrate 100, and the recessed sacrificial layer 120a may be anisotropically etched using the mask pattern as an etch mask to form the sacrificial contact patterns 121. Meanwhile, residual sacrificial patterns 122 may be formed under the lower sidewalls of the source/drain regions SD under which the first air gaps AG1 are not formed. This may be because portions of the recessed sacrificial layer 120 under the lower sidewalls of the source/drain regions SD are not etched but remain during the anisotropic etching process. In the present embodiment, the sacrificial contact patterns 121 are formed between the sacrificial gate structures SGS. However, the inventive concepts are not limited thereto.

Figure 12:
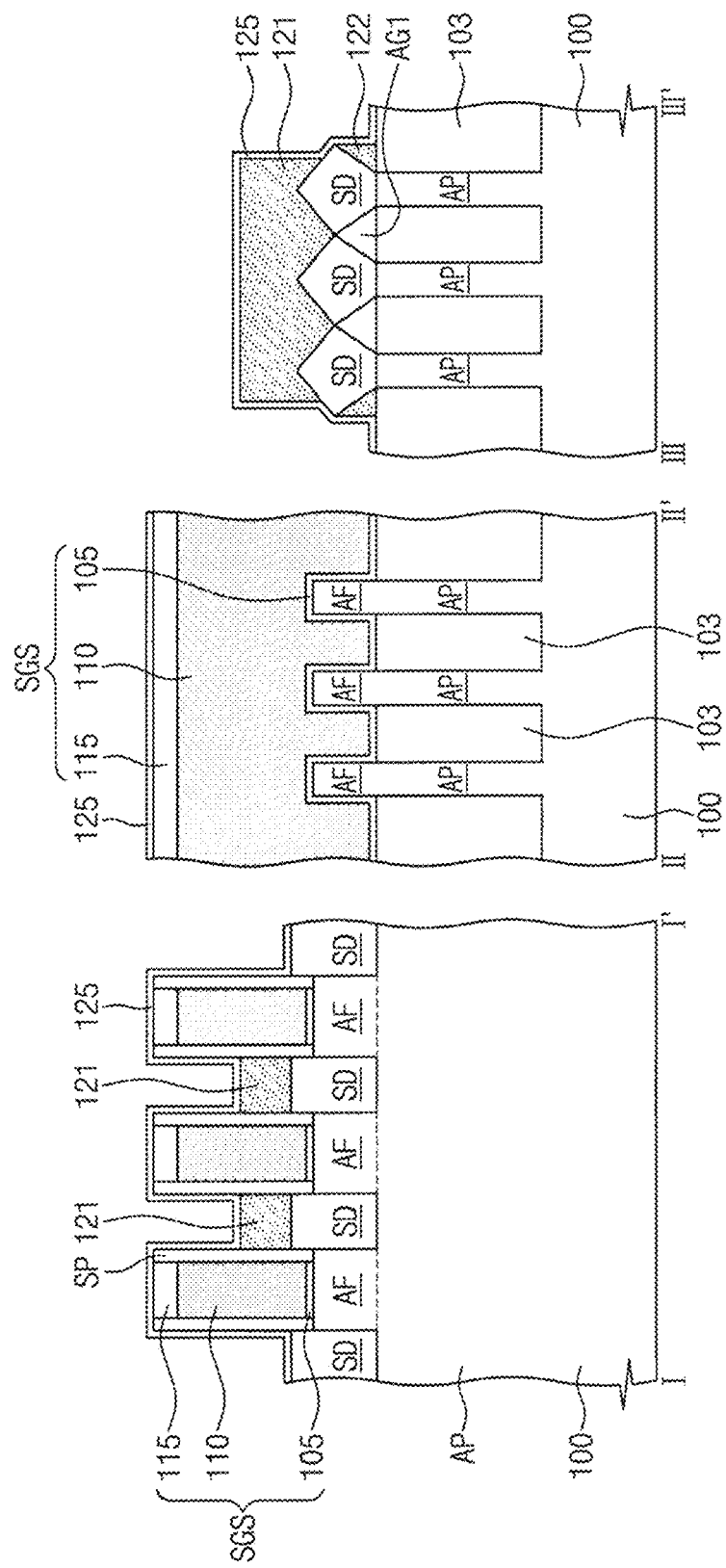

Referring to FIG. 12, a capping layer 125 may be conformally formed on the resultant structure of FIG. 11. In other words, the capping layer 125 may conformally cover the resultant structure of FIG. 11. Thus, the capping layer 125 may be in contact with and cover sidewalls and top surfaces of the sacrificial contact patterns 121. In addition, the capping layer 125 may also be in contact with and cover sidewalls of the residual sacrificial patterns 122. In an embodiment, the capping layer 125 may be formed by an ALD process. The capping layer 125 may be a gas-permeable layer. For example, the capping layer 125 may include a silicon oxide layer or porous silicon oxy-hydrocarbon layer formed by a deposition process. The capping layer 125 may have a relatively thin thickness when the capping layer 125 includes the silicon oxide layer, but the capping layer 125 may have a relatively thick thickness when the capping layer 125 includes the porous silicon oxy-hydrocarbon layer. For example, if the capping layer 125 includes the silicon oxide layer, the thickness of the capping layer 125 may range from 1 nm to 1.5 nm.

Figure 13:
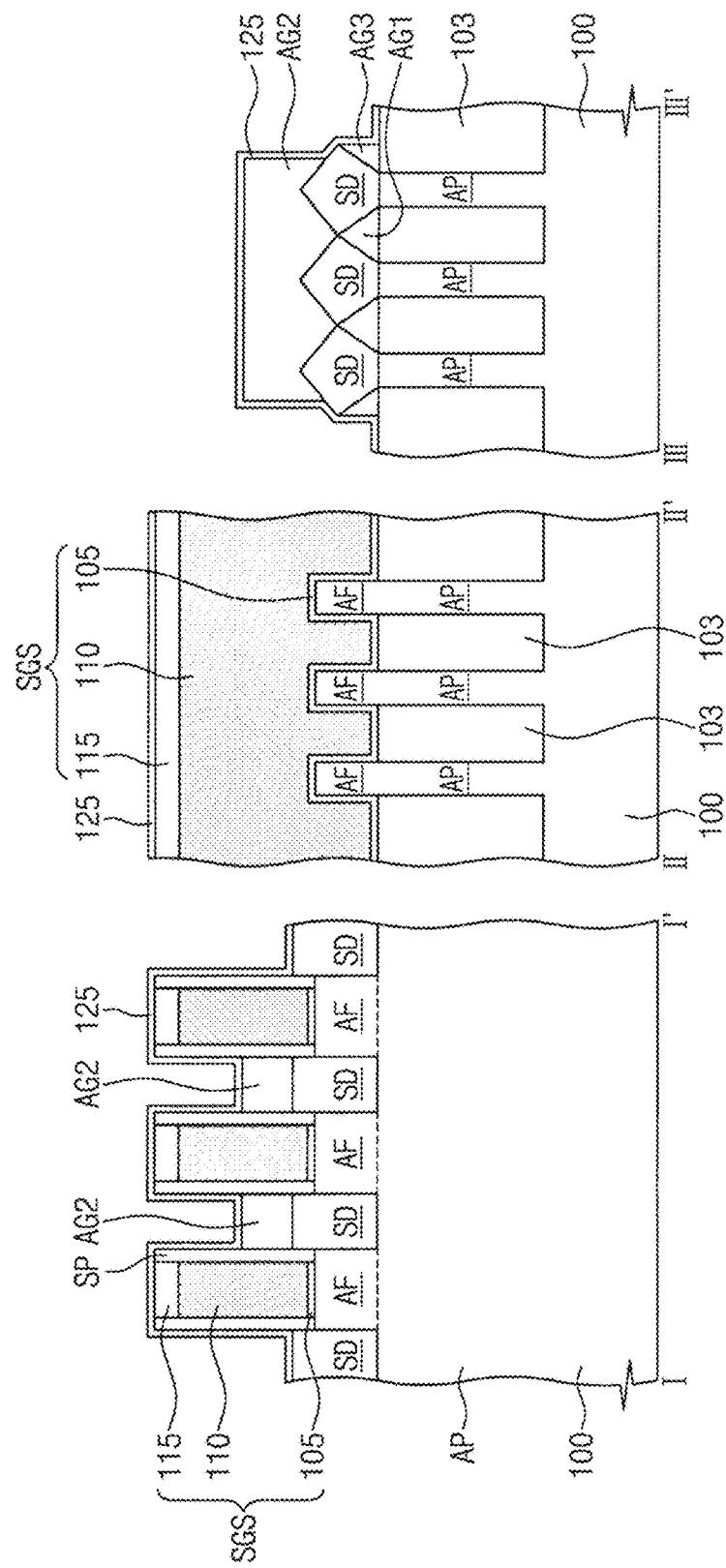

Referring to FIG. 13, the sacrificial contact patterns 121 that are covered with the capping layer 125 may be selectively removed. In an embodiment, the selective removal of the sacrificial contact patterns 121 may be performed using an ashing process. The ashing process may be performed at a temperature of 20 degrees Celsius to 400 degrees Celsius by supplying a process gas capable of generating hydrogen radicals or oxygen radicals. For example, the process gas may include at least one of ammonia ($NH_3$), hydrogen ($H_2$), dinitrogen monoxide ($N_2O$), oxygen ($O_2$), carbon dioxide ($CO_2$), or carbon monoxide (CO). At this time, the hydrogen radicals or oxygen radicals generated in the ashing process may penetrate the capping layer 125 to react with hydrocarbon of the sacrificial contact patterns 121. Thus, a phase of the sacrificial contact patterns 121 may be converted into a gaseous phase (e.g., methane ($CH_3$), carbon dioxide ($CO_2$), or carbon monoxide (CO)), which can escape through the gas-permeable capping layer 125. As a result, the sacrificial contact patterns 121 may be removed, and at the same time, second air gaps AG2 may be formed in spaces from which the sacrificial contact patterns 121 are removed. Here, the second air gaps AG2 may be defined by the capping layer 125 covering the sidewalls and the top surfaces of the sacrificial contact patterns 121 and the gate spacers SP being in contact with the sacrificial contact patterns 121. The residual sacrificial patterns 122 may also be removed during the ashing process, and thus, third air gaps AG3 may be formed in spaces from which the residual sacrificial patterns 122 are removed. Meanwhile, in other embodiments, the sacrificial contact patterns 121 may be selectively removed by a process using ultraviolet rays.

Figure 14:
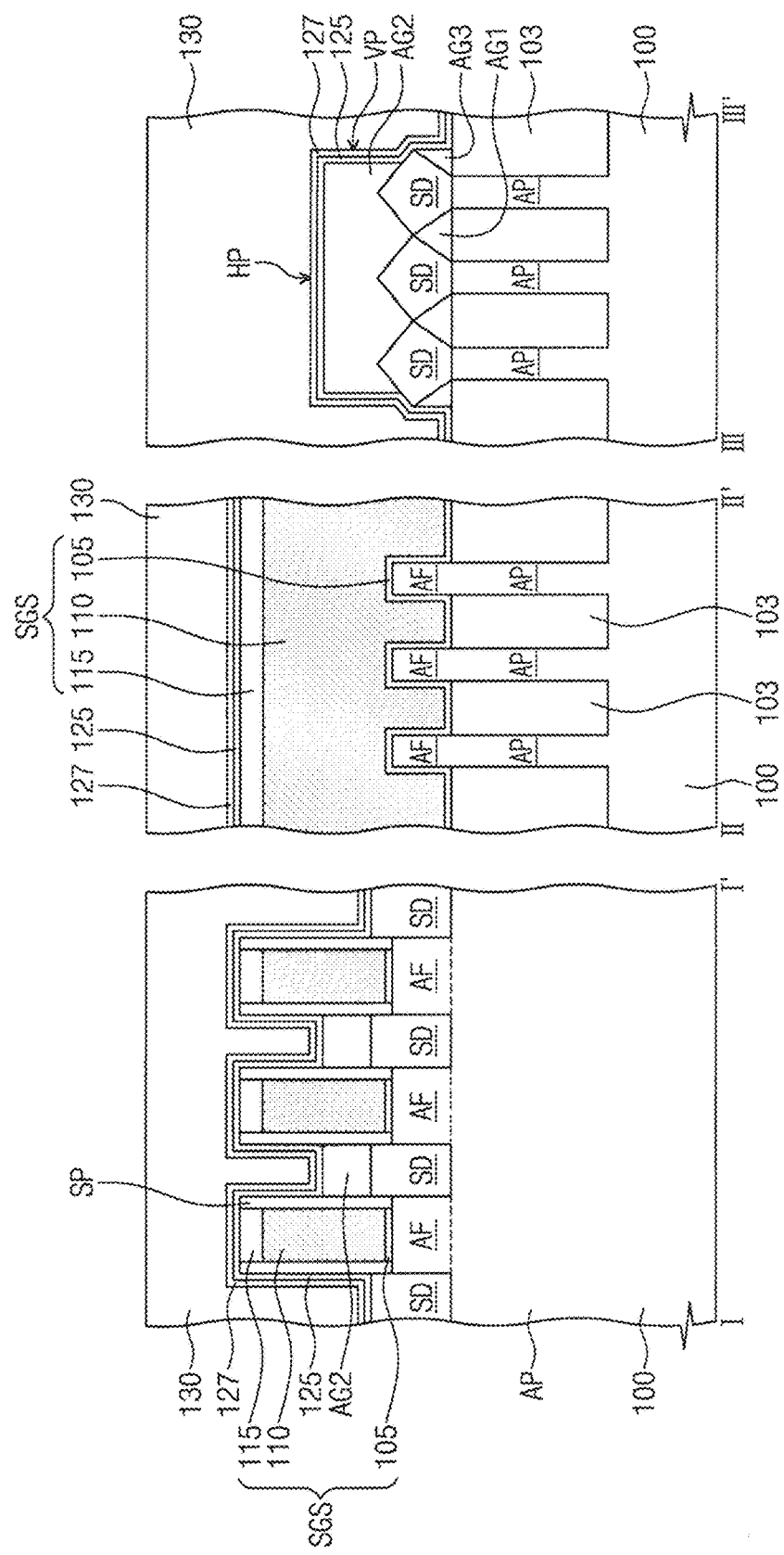

Referring to FIG. 14, a contact etch stop layer 127 may be conformally formed on an entire surface of the substrate 100. In other words, the contact etch stop layer 127 may be in contact with and be conformally formed on the capping layer 125. The contact etch stop layer 127 may be formed of the same material as the gate spacers SP. That is, the contact etch stop layer 127 may be formed of a material having an etch selectivity with respect to a first interlayer insulating layer 130 to be described later. For example, the contact etch stop layer 127 may include a silicon nitride layer and/or a silicon oxynitride layer. The contact etch stop layer 127 may be formed by a CVD process or an ALD process. Hereinafter, for the purpose of ease and convenience in explanation, a portion of the capping layer 125 and a portion of the contact etch stop layer 127 which are disposed on a top surface of the second air gap AG2 may be defined as a horizontal portion HP, and another portion of the capping layer 125 and another portions of the contact etch stop layer 127 which are disposed on a sidewall of the second air gap AG2 may be defined as a vertical portion VP.

Next, the first interlayer insulating layer 140 may be formed on the substrate 100. The first interlayer insulating layer 130 may fill spaces between the sacrificial gate structures SGS and may cover the top surfaces of the sacrificial gate structures SGS. For example, the first interlayer insulating layer 130 may include at least one of a silicon oxide layer or low-k dielectric layers. Unlike FIG. 14, a top surface of the first interlayer insulating layer 130 may have a height difference.

Figure 15:
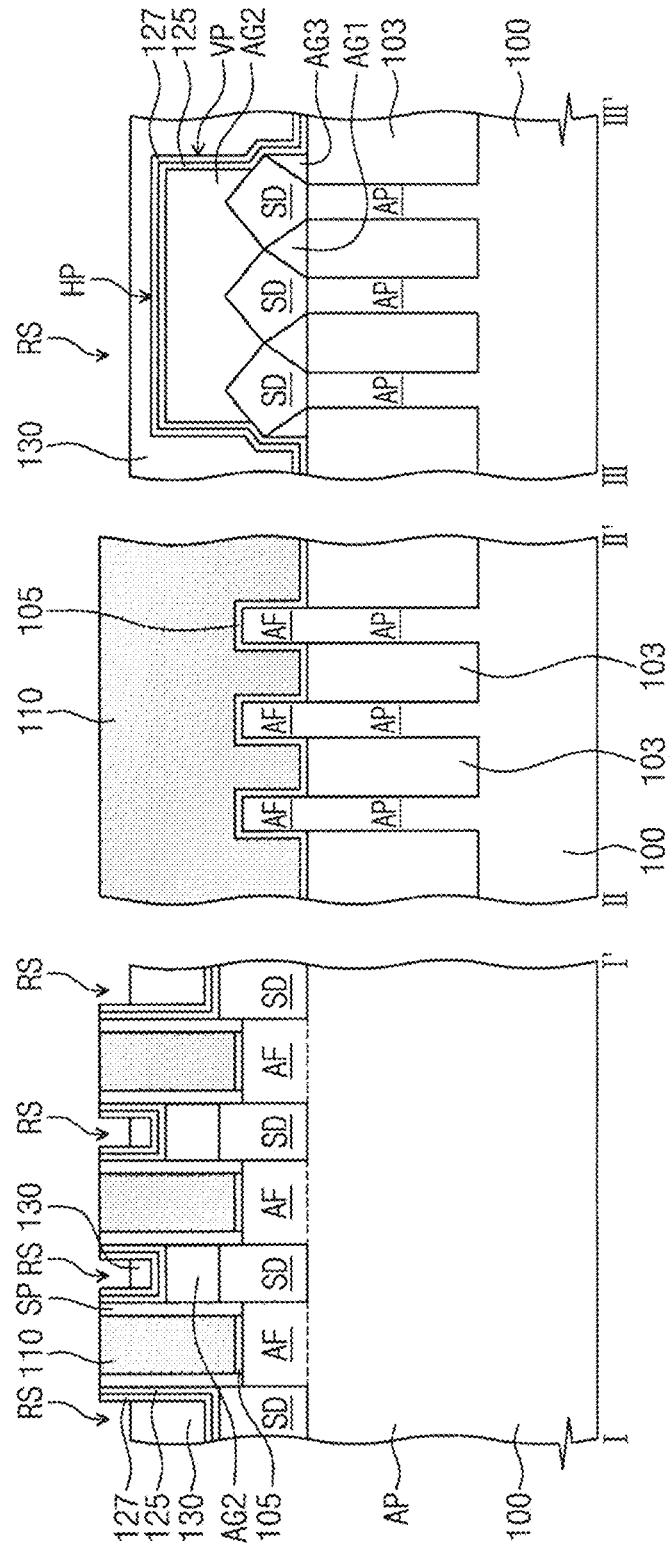

Referring to FIG. 15, the first interlayer insulating layer 130 may be planarized to expose the top surfaces of the sacrificial gate patterns 110. The planarization process of the first interlayer insulating layer 130 may include an etch-back process and/or a chemical mechanical polishing (CMP) process. Thereafter, the planarized first interlayer insulating layer 130 may be partially recessed to form recess regions RS at both sides of the sacrificial gate pattern 110. The recess regions RS may expose portions of the contact etch stop layer 127. Recessing the first interlayer insulating layer 130 may be performed using a dry etching process selectively removing the first interlayer insulating layer 130. In other words, the dry etching process may be performed using an etchant having a sufficient etch selectivity with respect to the sacrificial gate pattern 110, the gate spacer SP, and the contact etch stop layer 127.

Figure 16:
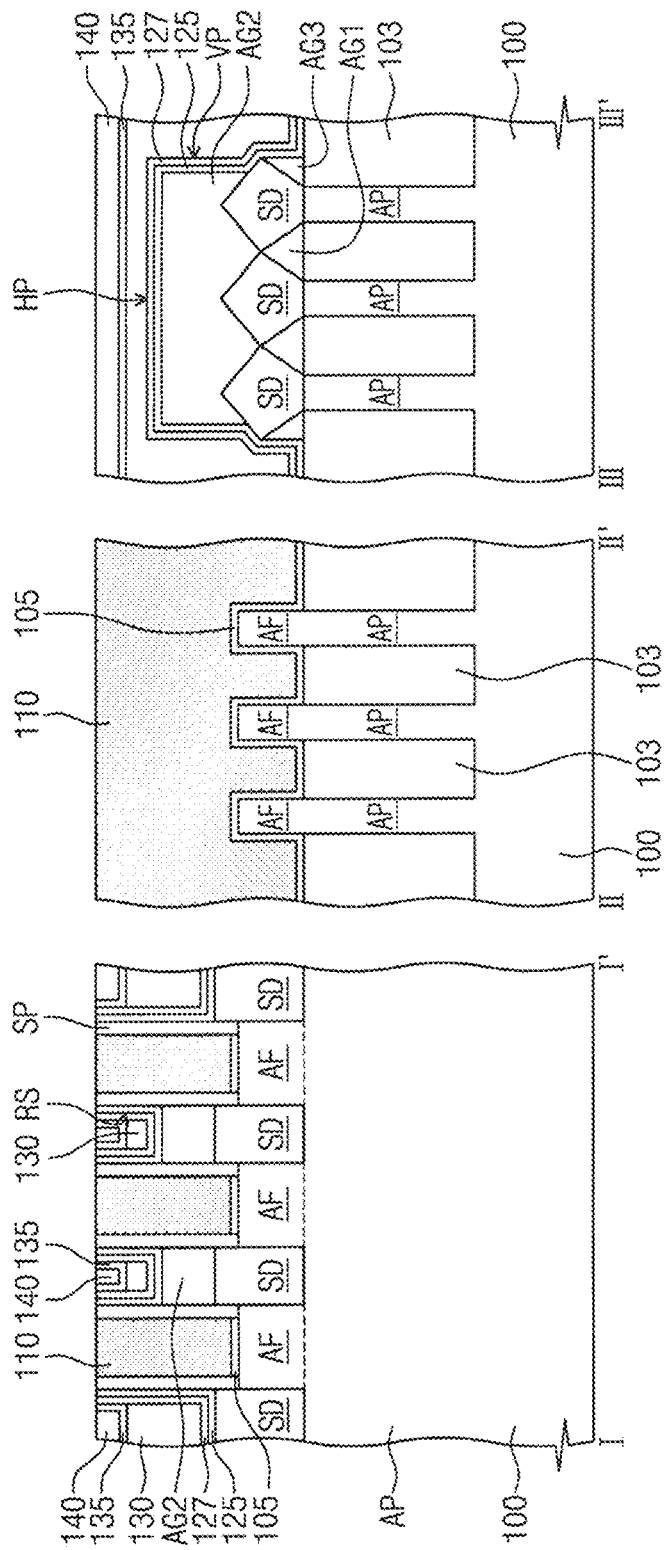

Referring to FIG. 16, a protection insulating pattern 135 and a filling insulating pattern 140 on the protection insulating pattern 135 may be formed in each of the recess regions RS. In more detail, a protection insulating layer may be formed on the substrate 100 to partially fill the recess regions RS. The protection insulating layer may include, for example, a silicon nitride layer. A filling insulating layer may be formed on the protection insulating layer to fill the rest of the recess regions RS. The filling insulating layer may include, for example, a silicon oxide layer. Next, the filling insulating layer and the protection insulating layer may be planarized until the top surfaces of the sacrificial gate patterns 110 are exposed, thereby forming the protection insulating pattern 135 and the filling insulating pattern 140. The planarization process may include an etch-back process and/or a CMP process. In other embodiments, the recess region RS may be fully filled with the protection insulating layer. In this case, only the protection insulating pattern 135 may be formed in each of the recess regions RS. The protection insulating pattern 135 may protect the first interlayer insulating layer 130 during formation of gap regions 141 to be described later.

Figure 17:
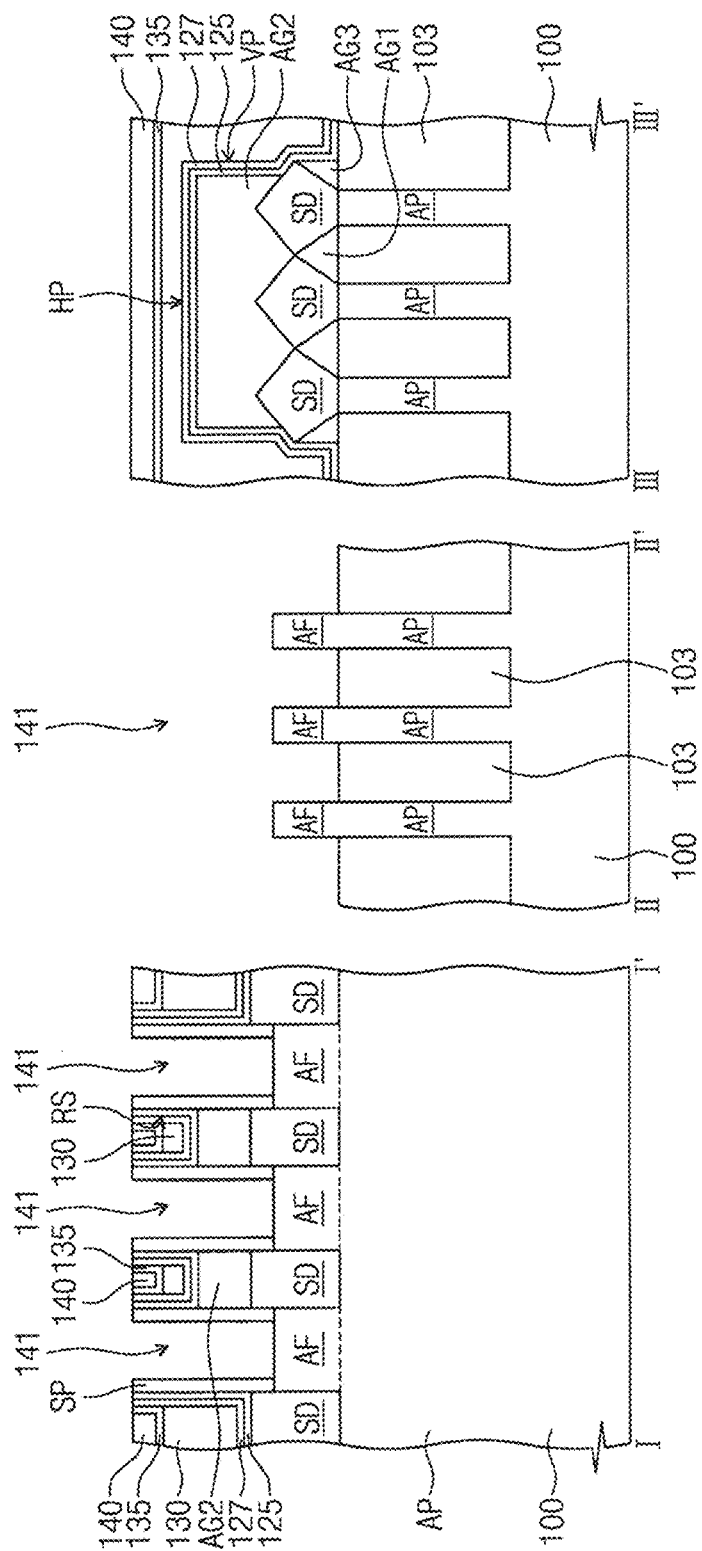

Referring to FIG. 17, the exposed sacrificial gate patterns 110 may be removed to form gap regions 141, each of which is disposed between gate spacers SP. The gap regions 141 may be formed by performing an etching process that selectively removes the sacrificial gate patterns 110 and the etch stop patterns 105.

Figure 18:
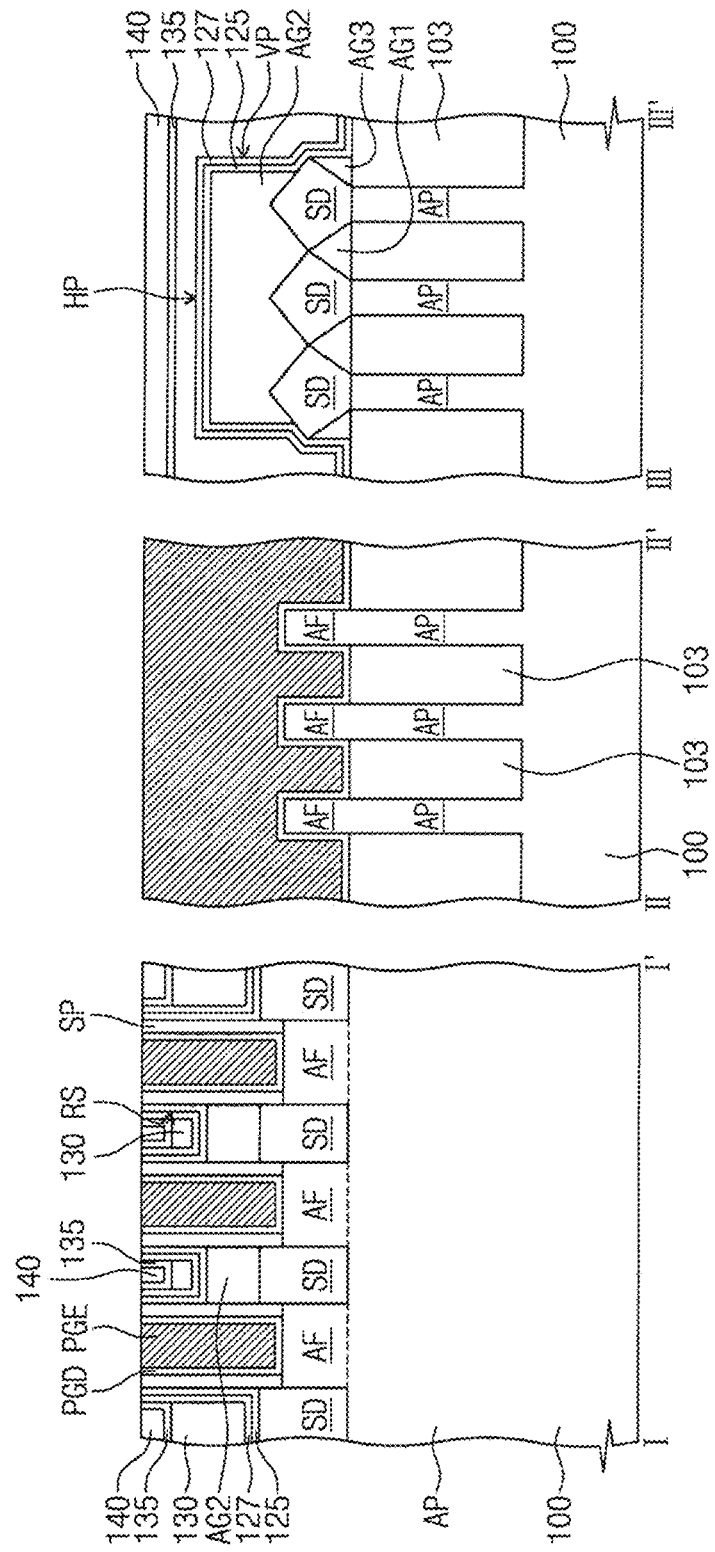

Referring to FIG. 18, a preliminary gate dielectric pattern PGD and a preliminary gate electrode PGE may be formed to fill each of the gap regions 141. In detail, a gate dielectric layer may be formed on the substrate 100 to partially fill the gap regions 141. The gate dielectric layer may be formed to cover the active fins AF exposed through the gap regions 141. The gate dielectric layer may include at least one of high-k dielectric layers. For example, the gate dielectric layer may include at least one of, but not limited to, hafnium oxide, hafnium silicate, zirconium oxide, or zirconium silicate. The gate dielectric layer may be formed by performing, for example, an ALD process. A gate layer may be formed on the gate dielectric layer to fill the rest regions of the gap regions 141. The gate layer may include at least one of a conductive metal nitride (e.g., titanium nitride or tantalum nitride) or a metal (e.g., aluminum or tungsten). The gate dielectric layer and the gate layer sequentially stacked may be planarized to form the preliminary gate dielectric pattern PGD and the preliminary gate electrode PGE. The top surfaces of the filling insulating pattern 140 and the gate spacers SP may be exposed by the planarization process. The preliminary gate dielectric pattern PGD may extend along a bottom surface of the preliminary gate electrode PGE and may also be disposed on both sidewalls of the preliminary gate electrode PGE so as to be disposed between the preliminary gate electrode PGE and the gate spacers SP.

Figure 19:
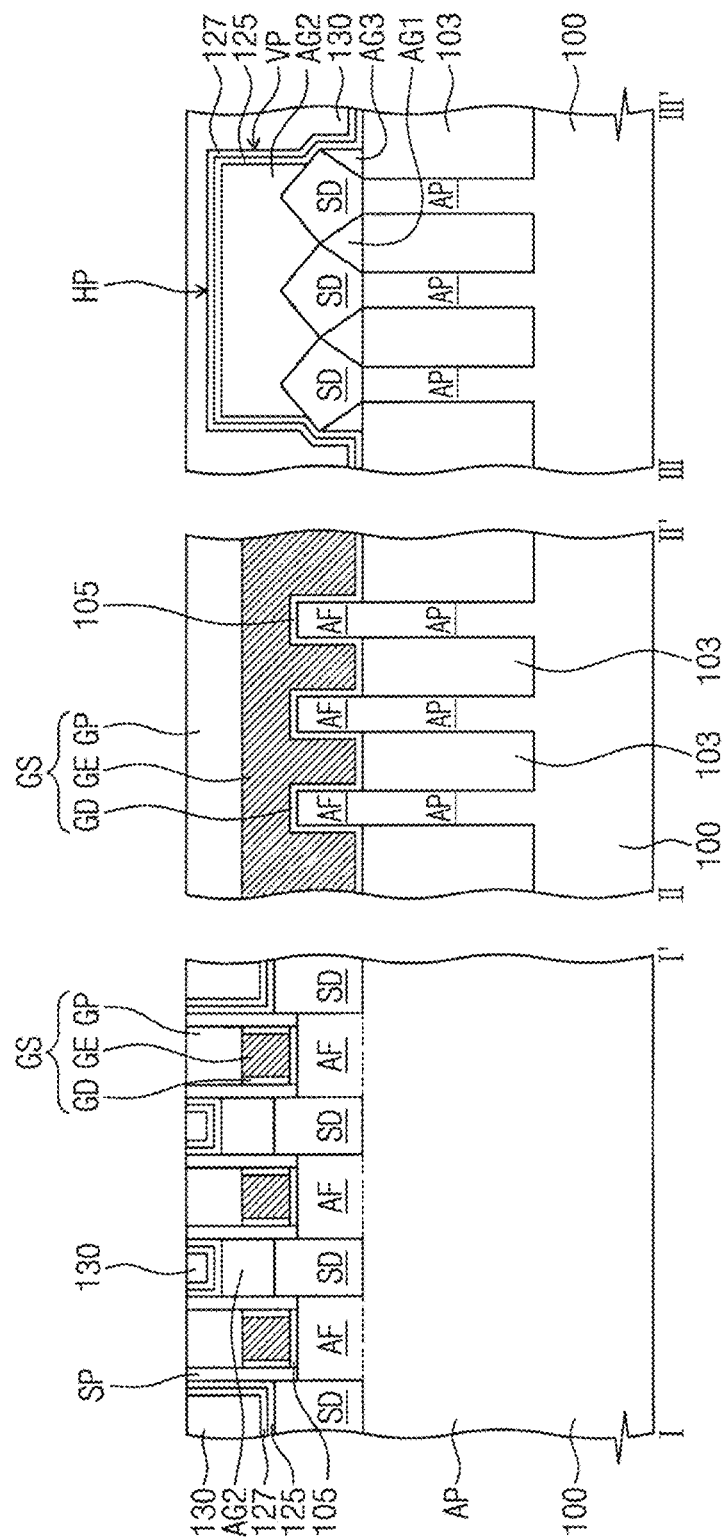

Referring to FIG. 19, an upper portion of the preliminary gate electrode PGE may be recessed to form a gate electrode GE. In more detail, recessing the preliminary gate electrode PGE may be performed using an etch process selectively removing the preliminary gate electrode PGE. In an embodiment, the etching process may be performed until a top surface of the gate electrode GE is disposed at a lower level than the top surface of the second air gap AG2. In other words, the top surface of the gate electrode GE may be lower than the top surface of the second air gap AG2. Thereafter, a portion of the preliminary gate dielectric pattern PGD, which is disposed at a higher level than the top surface of the gate electrode GE, may be removed to form a gate dielectric pattern GD.

Next, a gate capping pattern GP may be formed on the gate electrode GE. In more detail, a gate capping layer may be formed to fill the gap region 141 on the gate electrode GE. Subsequently, the gate capping layer may be planarized to form the gate capping pattern GD. The planarization process of the gate capping layer may be performed until the first interlayer insulating layer 130 is exposed. The protection insulating pattern 135 and the filling insulating pattern 140 may be removed by the planarization process of the gate capping layer. The gate capping layer may include, for example, a silicon nitride layer and/or a silicon oxynitride layer. The gate capping layer may be formed by a CVD process. The active fins AF disposed under the gate electrode GE may be defined as channel regions CH. Each of the channel regions CH may be disposed between the source/drain regions SD. The gate dielectric pattern GD, the gate electrode GE, and the gate capping pattern GP may constitute a gate structure GS.

Figure 20:
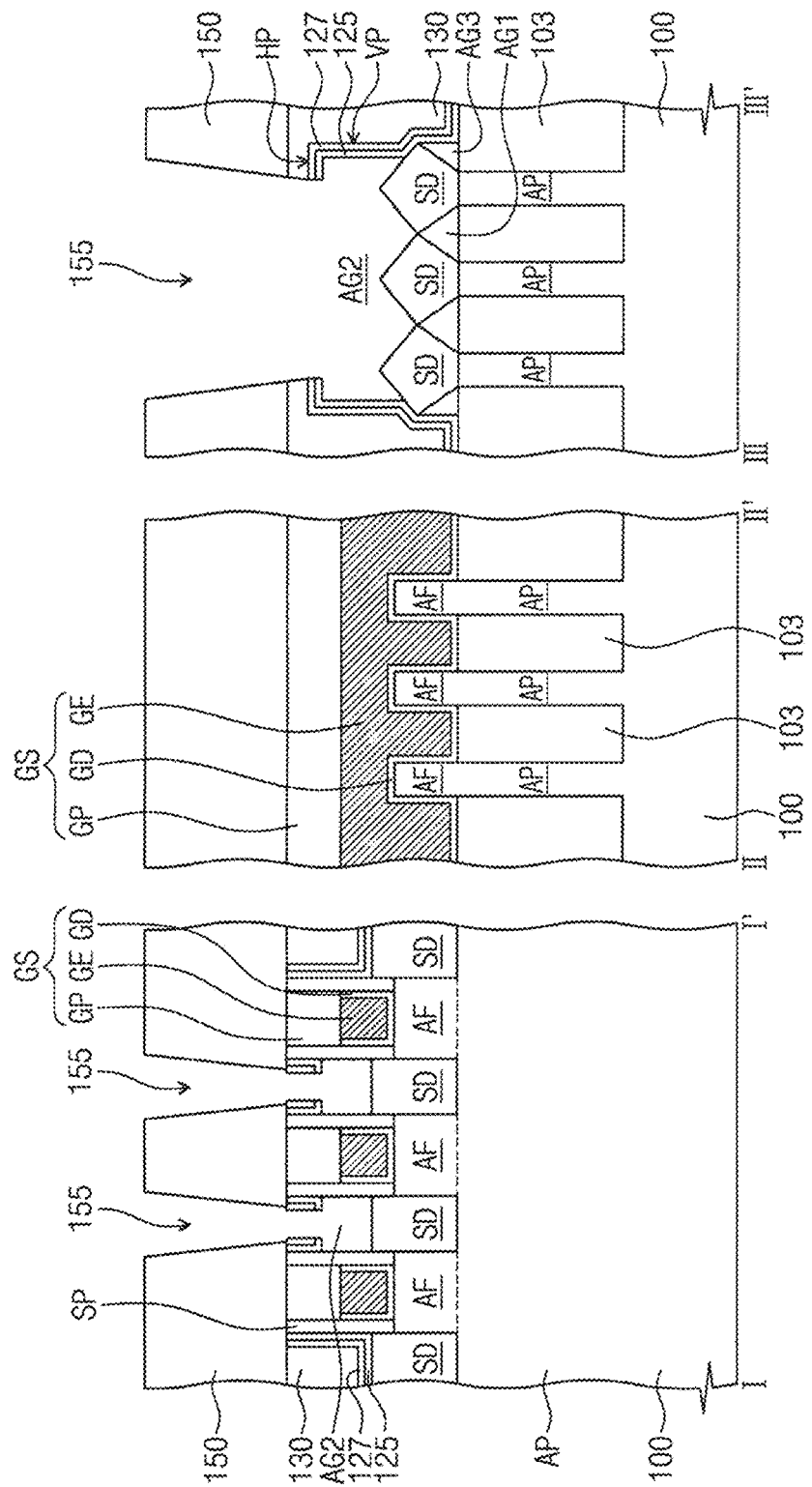

Referring to FIG. 20, a second interlayer insulating layer 150 may be formed on the resultant structure including the gate structure GS. The second interlayer insulating layer 150 may include at least one of a silicon oxide layer, a silicon nitride layer, a silicon oxynitride layer, or low-k dielectric layers. The second interlayer insulating layer 150 may be formed by a CVD process.

Subsequently, contact holes 155 may be formed to penetrate the second interlayer insulating layer 150, the first interlayer insulating layer 140, the contact etch stop layer 127, and the capping layer 125. The contact holes 155 may open the second air gaps AG2. Without the second air gaps AG2, the aspect ratio of the contact holes 155 may be too high to fully penetrate to the source/drain regions S/D. In some embodiments, a mask pattern (not shown) may be formed on the second interlayer insulating layer 150, and an anisotropic etching process may be performed using the mask pattern as an etch mask to form the contact holes 155. The anisotropic etching process may be performed until portions (e.g., the horizontal portion HP) of the capping layer 125 and contact etch stop layer 127 covering the top surface of the second air gap AG2 are removed. As a result, each of the contact holes 155 may be connected to each of the second air gaps AG2 to expose the plurality of source/drain regions SD. In addition, the contact holes 155 may also expose portions of the contact etch stop layer 127 which are disposed on sidewalls of the gate structures GS. In other words, the contact holes 155 may be formed to self-aligned with the contact etch stop layer 127 disposed on the sidewalls of the gate structures GS.

According to some embodiments, if a width of the contact hole 155 is smaller than that of the second air gap AG2 at a boundary between the contact hole 155 and the second air gap AG2 in a cross-sectional view taken along the second direction D2 as illustrated in FIG. 20, a portion of the horizontal portion HP may be removed to open the second air gap AG2.

Figure 21:
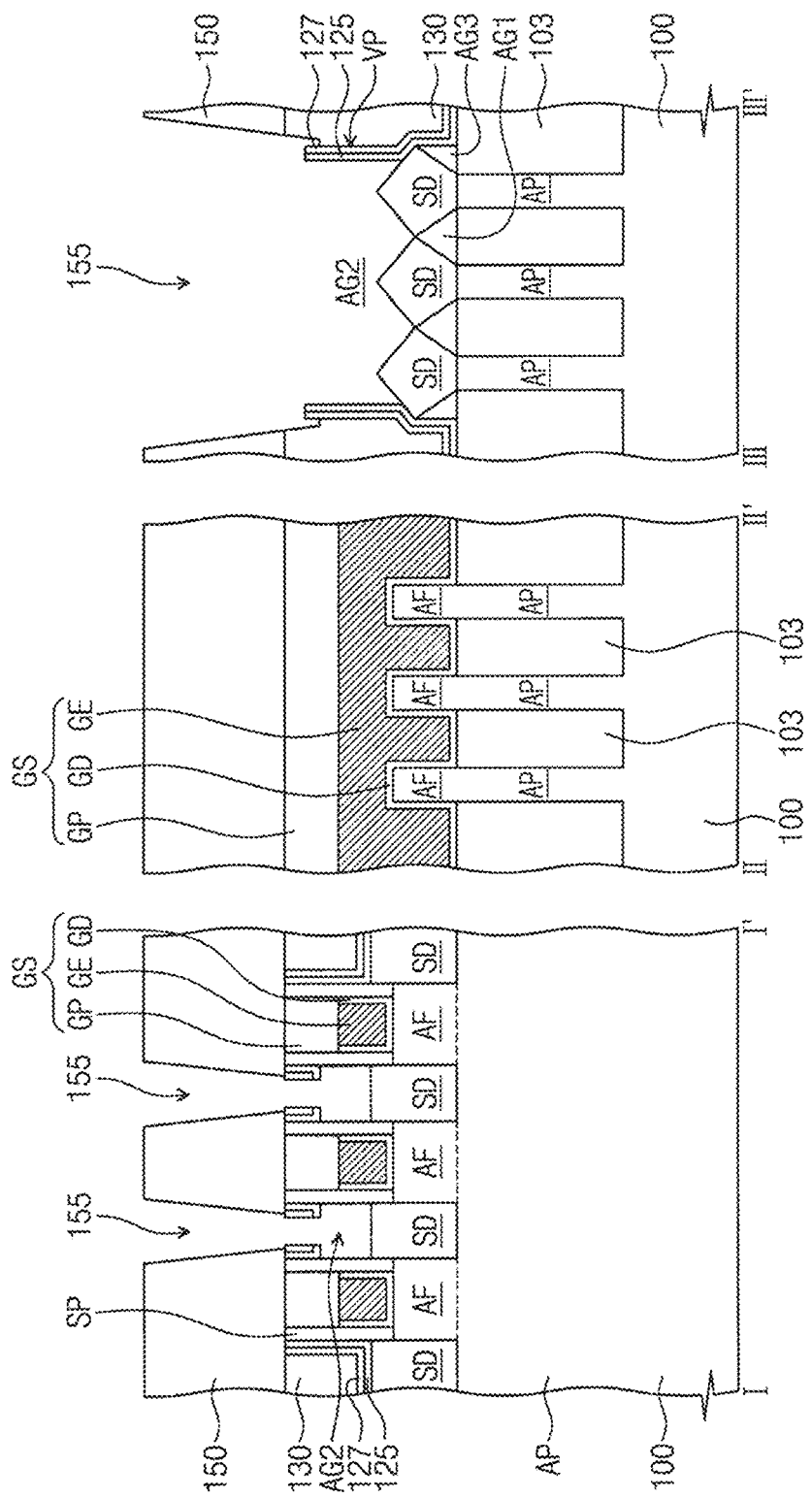

According to other embodiments, if the width of the contact hole 155 is greater than that of the second air gap AG2 at the boundary between the contact hole 155 and the second air gap AG2 in the cross-sectional view taken along the second direction D2 as illustrated in FIG. 21, an entire portion of the horizontal portion HP may be removed to open the second air gap AG2. At this time, a portion of the first interlayer insulating layer 130 adjacent to the vertical portion VP may be further etched during the removal of the horizontal portion HP.

Upper portions of source/drain regions formed of epitaxial patterns may generally have wedge shapes, so the uppermost ends of the source/drain regions initially exposed by a contact hole may be lost during formation of the contact hole exposing the source/drain regions. To reduce of this loss, a contact etch stop layer may be formed on the source/drain regions. However, it may not be easy to remove the part of the contact etch stop layer that is disposed on the source/drain regions and it may be difficult to avoid loss of the uppermost ends of the source/drain regions during the removal of the part of the contact etch stop layer that is disposed on the source/drain regions. This is because a profile of the contact etch stop layer also has a wedge shape. According to embodiments of the inventive concepts, since the air gap AG2 is formed on the source/drain regions, only the etching process for exposing the air gap AG2 may be performed to expose the source/drain regions SD. As a result, it is possible to reduce damage to the source/drain regions SD that may otherwise occur during the etching process for forming the contact holes 155. This means that electrical characteristics of the semiconductor device may be improved.

Referring again to FIG. 5, a source/drain contact 160 may be formed in each of the second air gaps AG2 and each of the contact holes 155 connected to each other. In more detail, a conductive material layer may be formed on the substrate 10 to fill the second air gaps AG2 and the contact holes 155, and then, the conductive material layer may be planarized until a top surface of the second interlayer insulating layer 150 is exposed, thereby forming the source/drain contacts 160. In an embodiment, forming the conductive material layer may include sequentially depositing a first conductive layer and a second conductive layer. The first conductive layer may include a barrier conductive layer. For example, the first conductive layer may include at least one of a titanium nitride layer, a tungsten nitride layer, or a tantalum nitride layer. The second conductive layer may include a metal layer. For example, the second conductive layer may include at least one of a tungsten layer, a titanium layer, or a tantalum layer. In addition, a thermal treatment process may be performed after the formation of the first conductive layer, so a metal silicide layer may be formed between the first conductive layer and each of the source/drain regions SD. For example, the metal silicide layer may include at least one of a titanium silicide layer, a tantalum silicide layer, or a tungsten silicide layer.

Even though not shown in the drawings, interconnections connected to the source/drain contacts 160 may be formed on the second interlayer insulating layer 150. The interconnections may include a conductive material.

Figure 22:
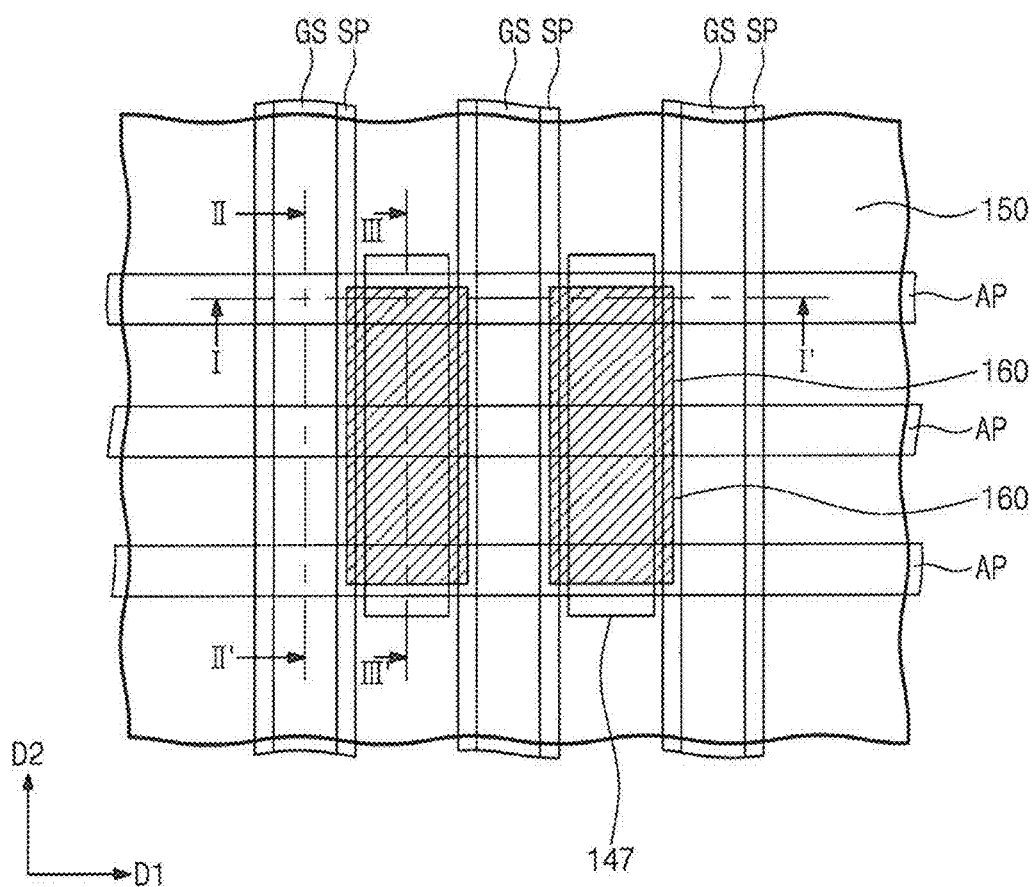
FIG. 22 is a plan view illustrating a semiconductor device according to embodiments of the inventive concepts.
Figure 23:
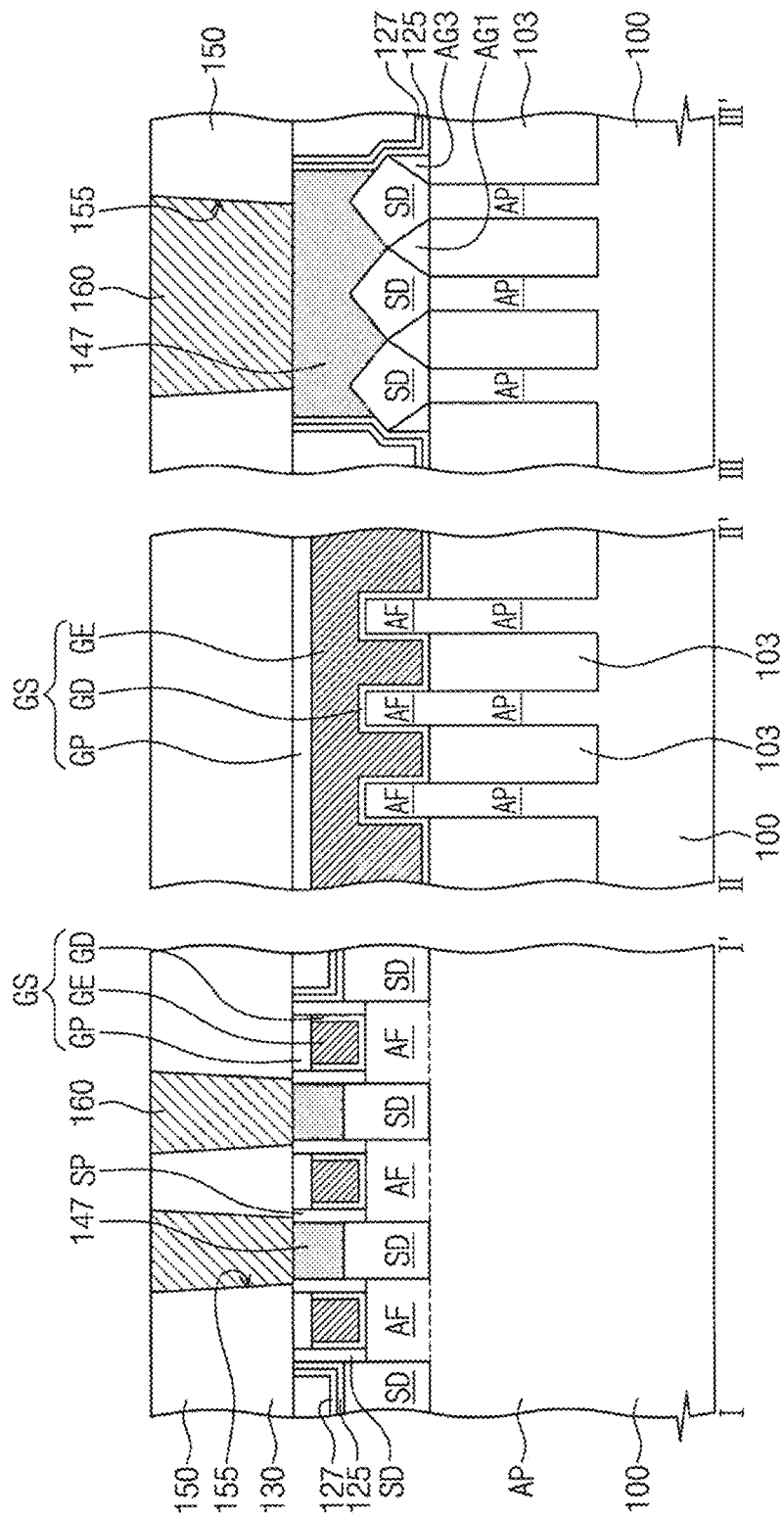
FIG. 23 is a cross-sectional view taken along lines I-I', II-II', and III-III' of FIG. 22.

Hereinafter, a semiconductor device according to embodiments of the inventive concepts will be described with reference to FIGS. 22 and 23. FIG. 22 is a plan view illustrating a semiconductor device according to embodiments of the inventive concepts. FIG. 23 is a cross-sectional view taken along lines I-I', II-II', and III-III' of FIG. 22. In the present embodiment, differences between the present embodiment and embodiments of FIGS. 4, 5 and 6A will be mainly described for the purpose of ease and convenience in explanation.

Referring to FIGS. 22 and 23, a connection conductive pattern 147 connected in common to a plurality of source/drain regions SD may be disposed between the gate structures GS adjacent to each other. In other words, the connection conductive pattern 147 may be in contact with the upper sidewalls of the plurality of source/drain regions SD. The connection conductive pattern 147 may cross over a plurality of active patterns AP when viewed from a plan view. A top surface of the connection conductive pattern 147 may be disposed at the substantially same height as the top surfaces of the gate structures GS. The connection conductive pattern 147 may correspond to the first portion P1a of the source/drain contact 160 of embodiments of FIGS. 4, 5 and 6A. However, an insulating material is not disposed between the connection conductive pattern 147 and the gate spacers SP in the present embodiment, unlike embodiments of FIGS. 4, 5 and 6A. The connection conductive pattern 147 may include at least one of a metal silicide layer (e.g., a titanium silicide layer, a tantalum silicide layer, or a tungsten silicide layer), a barrier conductive layer (e.g., a titanium nitride layer, a tungsten nitride layer, or a tantalum nitride layer), or a metal layer (e.g., a tungsten layer, a titanium layer, or a tantalum layer).

A source/drain contact 160 may penetrate the second interlayer insulating layer 150 so as to be in contact with the connection conductive pattern 147. The source/drain contact 160 may correspond to the third portion P3a of the source/drain contact 160 of embodiments of FIGS. 4, 5 and 6A. However, the source/drain contact 160 and the connection conductive pattern 147 disposed thereunder do not constitute one body in the present embodiment, unlike embodiments of FIGS. 4, 5 and 6A. The source/drain contact 160 may include at least one of a barrier conductive layer (e.g., a titanium nitride layer, a tungsten nitride layer, or a tantalum nitride layer) or a metal layer (e.g., a tungsten layer, a titanium layer, or a tantalum layer). Other elements of the semiconductor device according to the present embodiment may be the same as or similar to corresponding elements of the semiconductor devices described embodiments of FIGS. 4, 5 and 6A.

Interconnections connected to the source/drain contacts 160 may be disposed on the second interlayer insulating layer. The interconnections may be electrically connected to the source/drain regions SD through the source/drain contacts 160 and the connection conductive patterns 147. The interconnections may include a conductive material.

Figure 24:
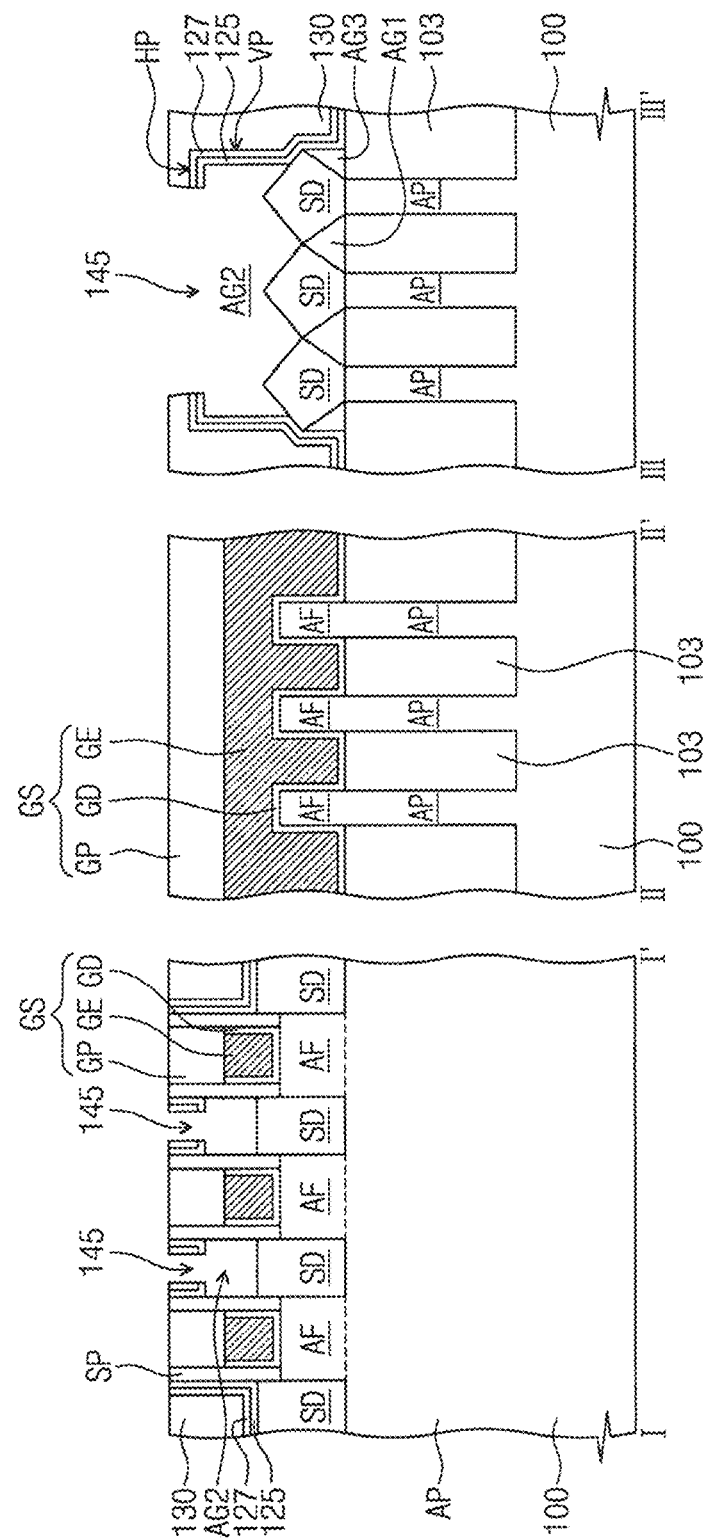
FIGS. 24 and 25 are cross-sectional views corresponding to the lines I-I', II-II', and III-III' of FIG. 22 to illustrate a method for manufacturing the semiconductor device according to embodiments of the inventive concepts.
Figure 25:
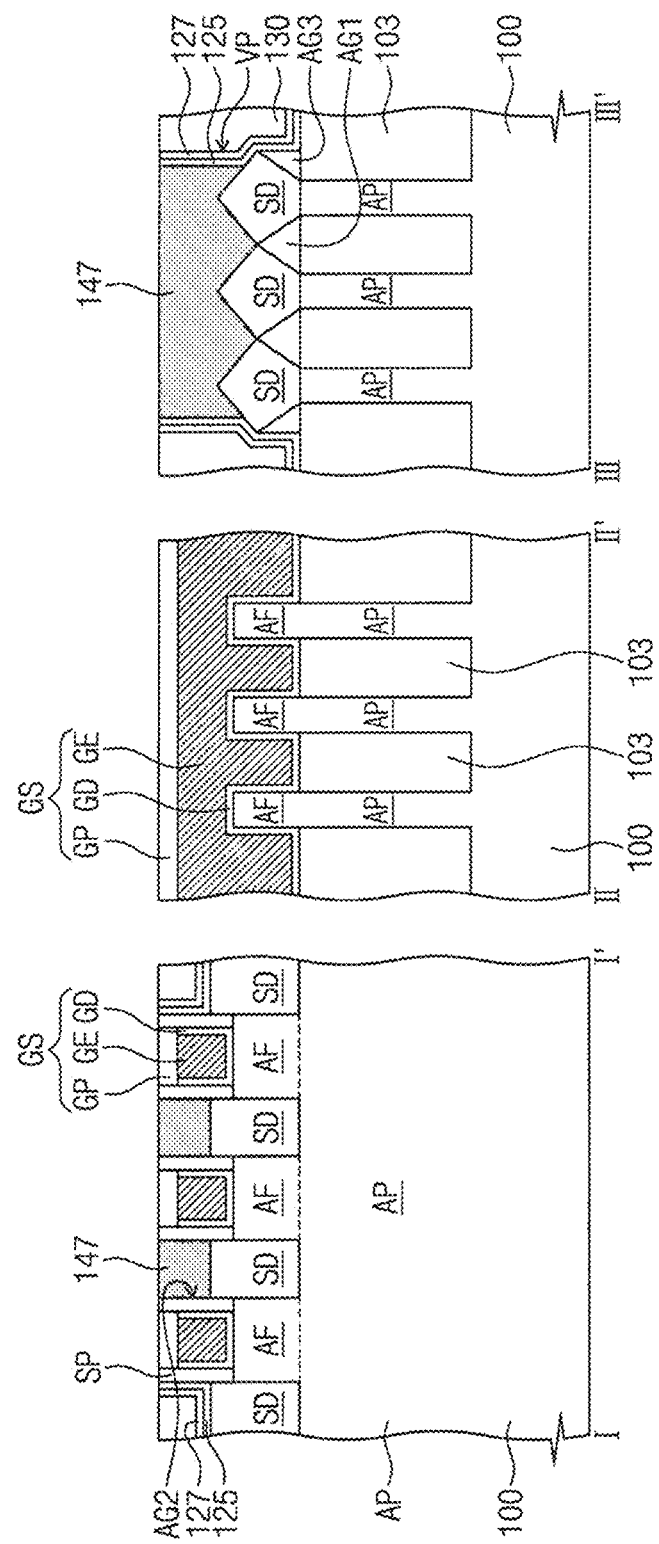

Hereinafter, a method for manufacturing the semiconductor device according to embodiments of FIGS. 22 and 23 of the inventive concepts will be described with reference to FIGS. 24 and 25. FIGS. 24 and 25 are cross-sectional views corresponding to the lines I-I', II-II', and III-III' of FIG. 22 to illustrate a method for manufacturing the semiconductor device according to embodiment s of FIGS. 22 and 23 of the inventive concepts. In the present embodiment, the same descriptions as in the manufacturing method of embodiments of FIGS. 4, 5 and 6A will be omitted or mentioned briefly for the purpose of ease and convenience in explanation.

Referring to FIG. 24, openings 145 may be formed to open the second air gaps AG2. A mask pattern (not shown) may be formed on the resultant structure of FIG. 19, and an etching process may be performed using the mask pattern as an etch mask to form the openings 145. Each of the openings 145 may be connected to each of the second air gaps AG2 to expose a plurality of source/drain regions SD.

Referring to FIG. 25, connection conductive patterns 147 may be formed in the second air gaps AG2, respectively. The second air gaps AG2 may be filled with a conductive material, and a planarization process may be performed on the conductive material to form the connection conductive patterns 147. The planarization process may be performed until an entire portion of the horizontal portion HP is removed. As a result, an insulating material (e.g., the capping layer 125 and the contact etch stop layer 127) may not be disposed between the connection conductive patterns 147 and the gate spacers SP. The planarization process may include an etch-back process and/or a CMP process.

Referring again to FIG. 23, a second interlayer insulating layer 150 including contact holes 155 may be formed on the resultant structure of FIG. 24. The contact holes 155 may expose the connection conductive patterns 147, respectively. Thereafter, source/drain contacts 160 may be formed in the contact holes 155, respectively.

Even though not shown in the drawings, interconnections may be formed on the second interlayer insulating layer 150 so as to be connected to the source/drain contacts 160. The interconnections may include a conductive material.

Figure 26:
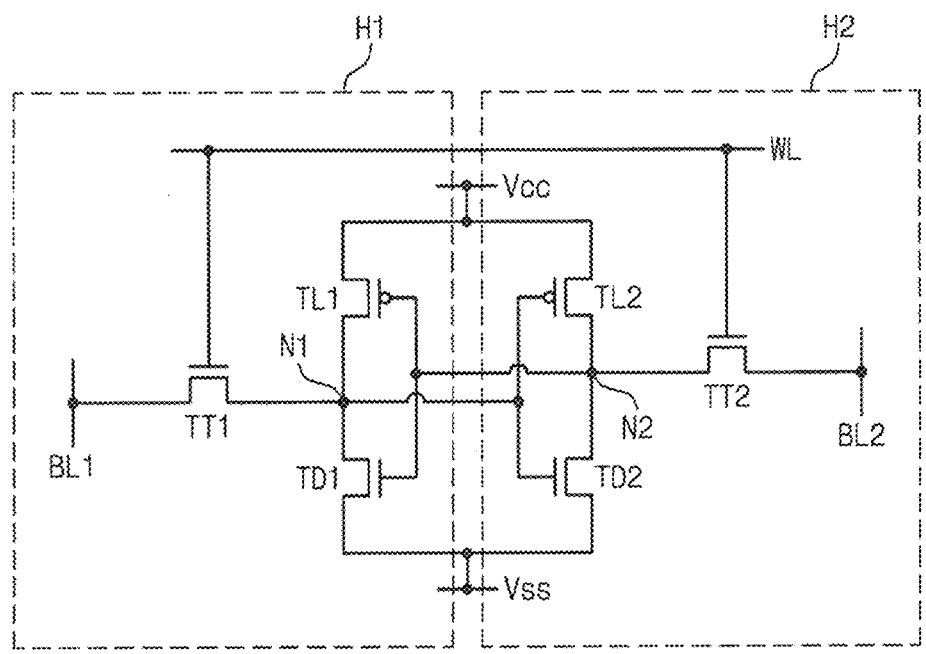
FIG. 26 is an equivalent circuit diagram of a complementary metal-oxide-semiconductor static random access memory cell (CMOS SRAM cell) including a field effect transistor according to embodiments of the inventive concepts.

FIG. 26 is an equivalent circuit diagram of a complementary metal-oxide-semiconductor static random access memory cell (CMOS SRAM cell) including a field effect transistor according to embodiments of the inventive concepts. Referring to FIG. 26, a CMOS SRAM cell may include a pair of driver transistors TD1 and TD2, a pair of transfer transistors TT1 and TT2, and a pair of load transistors TL1 and TL2. The driver transistors TD1 and TD2 may correspond to pull-down transistors, the transfer transistors TT1 and TT2 may correspond to pass transistors, and the load transistors TL1 and TL2 may correspond to pull-up transistors. The driver transistors TD1 and TD2 and the transfer transistors TT1 and TT2 may be NMOS transistors, and the load transistors TL1 and TL2 may be PMOS transistors. At least one of the driver transistors TD1 and TD2, the transfer transistors TT1 and TT2 and the driver transistors TL1 and TL2 may be at least one of the transistors according to the aforementioned embodiments of the inventive concepts.

The first driver transistor TD1 and the first transfer transistor TT1 may be in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be in series to each other. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power line Vcc and a drain region of the first driver transistor TD1, respectively. A source region and a drain region of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may correspond to a first node N1. The drain region of the second load transistor TL2, the drain region of the second driver transistor TD2, and a source region of the second transfer transistor TT2 may correspond to a second node N2. A gate electrode of the first driver transistor TD1 and a gate electrode of the first load transistor TL1 may be electrically connected to the second node N2. A gate electrode of the second driver transistor TD2 and a gate electrode of the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half-cell H1, and the second driver transistor TD2, the second transfer transistor TT2, and the second load transistor TL2 may constitute a second half-cell H2.

Figure 27:
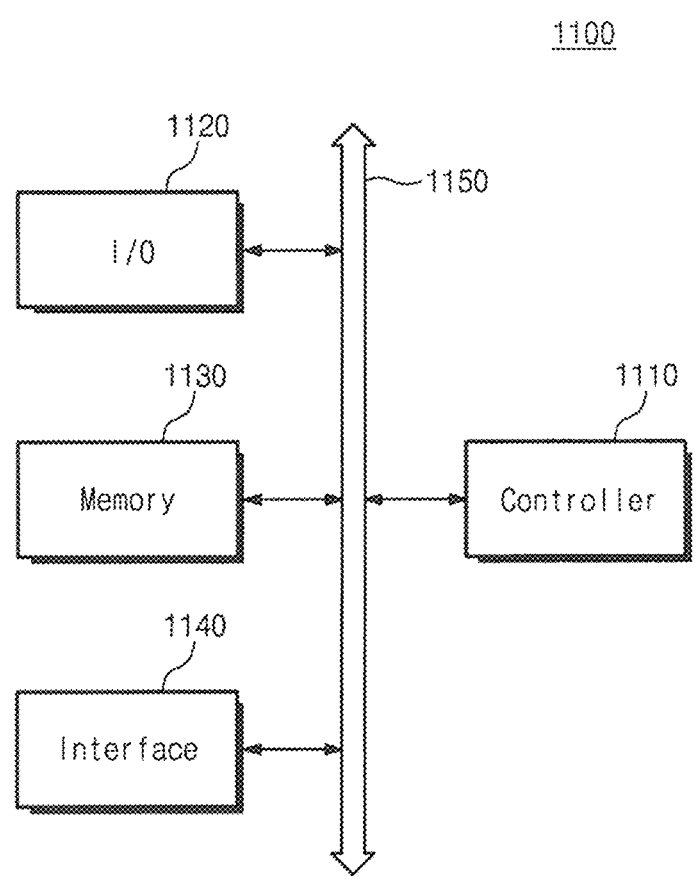
FIG. 27 is a schematic block diagram illustrating an electronic system including a semiconductor device according to embodiments of the inventive concepts.

FIG. 27 is a schematic block diagram illustrating an electronic system including a semiconductor device according to embodiments of the inventive concepts.

Referring to FIG. 27, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast dynamic random access memory (DRAM) device and/or a fast static random access memory (SRAM) device which acts as a cache memory for improving an operation of the controller 1110. At least one of the semiconductor devices according to the aforementioned embodiments of the inventive concepts may be provided in the memory device 1130 and/or may be provided in the controller 1110 and/or the I/O 1120.

The electronic system 1100 may be applied to a personal digital assistant (PDA), a portable computer, a web tablet, a wireless phone, a mobile phone, a digital music player, a memory card, or other electronic products receiving or transmitting information data by wireless.

Figure 28:
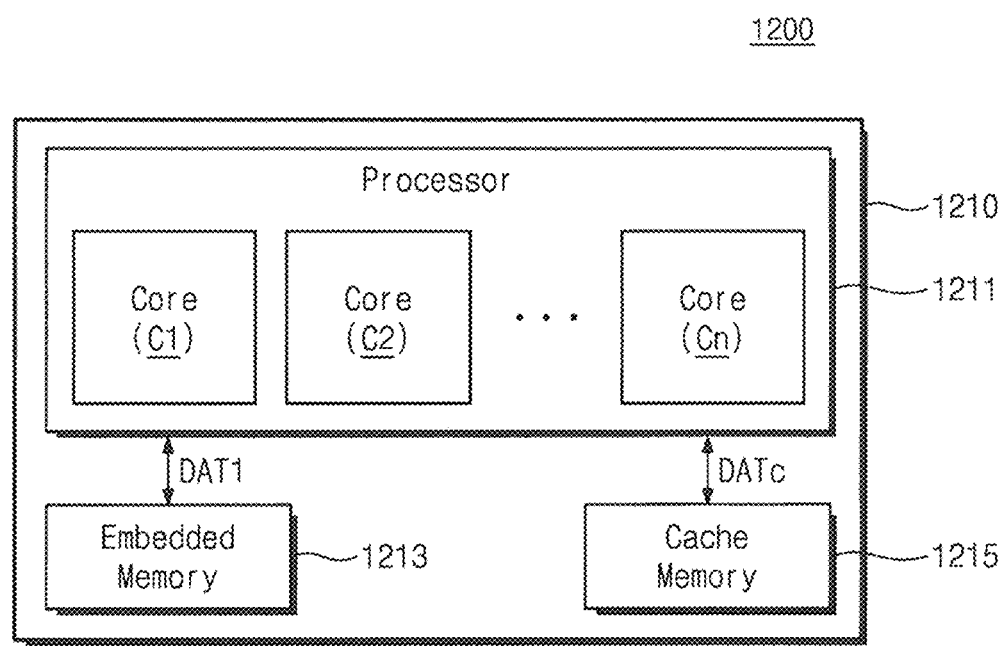
FIG. 28 is a schematic block diagram illustrating an electronic device including a semiconductor device according to embodiments of the inventive concepts.

FIG. 28 is a schematic block diagram illustrating an electronic device including a semiconductor device according to embodiments of the inventive concepts.

Referring to FIG. 28, an electronic device 1200 may include a semiconductor chip 1210. The semiconductor device 1210 may include a processor 1211, an embedded memory 1213, and a cache memory 1215.

The processor 1211 may include one or more processor cores C1 to Cn. The one or more process cores C1 to Cn may process electrical data and/or electrical signals. The processor cores C1 to Cn may include the semiconductor device according to embodiments of the inventive concepts.

The electronic device 1200 may perform a specific function by means of the processed data and signals. For example, the processor 1211 may be an application processor.

The embedded memory 1213 may exchange first data DAT1 with the processor 1211. The first data DAT1 is data processed or to be processed by the one and more processor cores C1 to Cn. The embedded memory 1213 may manage the first data DAT1. For example, the embedded memory 1213 may buffer the first data DAT1. In other words, the embedded memory 1213 may act as a buffer memory or a working memory of the processor 1211.

In some embodiments, the electronic device 1200 may be applied to a wearable electronic device. The wearable electronic device may mainly perform a function requiring a relatively small quantity of operations. Thus, if the electronic device 1200 is applied to the wearable electronic device, the embedded memory 1213 may not have a great buffer capacity.

The embedded memory 1213 may be a SRAM. An operating speed of the SRAM may be faster than that of a DRAM. If the SRAM is embedded in the semiconductor chip 1210, it is possible to realize the electronic device 1200 having a small size and a fast operating speed. In addition, if the SRAM is embedded in the semiconductor chip 1210, consumption of an active power of the electronic device 1200 may be reduced. The SRAM may include the semiconductor device according to embodiments of the inventive concepts.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. The cache memory 1215 may include a SRAM including the semiconductor device according to embodiments of the inventive concepts. If the cache memory 1215 is used, it is possible to reduce an accessing number and an accessing time of the processor 1211 to the embedded memory 1213. Thus, the operating speed of the electronic device 1200 may be improved when the cache memory 1215 is used.

In FIG. 28, the cache memory 1215 is distinguished from the processor 1211 for the purpose of ease and convenience in explanation. However, in other embodiments, the cache memory 1215 may be configured to be included in the processor 1211. In other words, the inventive concepts are not limited to the embodiment illustrated in FIG. 28.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 29:
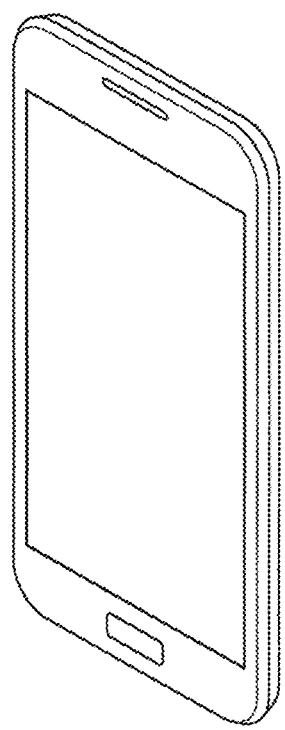
FIG. 29 illustrates a mobile phone implemented with an electronic system according to embodiments of the inventive concepts.

The electronic system 1100 of FIG. 27 may be applied to electronic control systems of various electronic devices. FIG. 29 illustrates a mobile phone 2000 implemented with the electronic system of FIG. 27. In other embodiments, the electronic system 1100 of FIG. 27 may be applied to a portable computer, a MP3 player, a navigation device, a solid state disk (SSD), a car, or household appliances.

According to embodiments of the inventive concepts, since an air gap is formed on a source/drain region of a MOSFET device before a contact is formed on the source/drain region, an etching process for forming a contact hole may only need to open the air gap to expose the source/drain region. That is, the etch process may not have to be performed all the way to the source/drain region. This may reduce damage to the source/drain region during the etching process for forming the contact hole, and may enable the formation of contact holes with higher aspect ratios. Accordingly, the electrical characteristics of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   an active pattern;
   a gate structure crossing over the active pattern;
   a gate spacer on a sidewall of the gate structure;
   a source/drain region on the active pattern at a side of the gate structure;
   a source/drain contact on the source/drain region and connected to the source/drain region; and
   a gas-permeable layer between the gate spacer and the source/drain contact,
   wherein the source/drain contact comprises:
   a first portion at a side of the gate structure, the first portion being in contact with the gate spacer;
   a second portion on the first portion, the second portion being spaced apart from the gate spacer; and
   a third portion on the second portion,
   wherein a first boundary between the second and third portions is at substantially a same height as a top surface of the gate structure; and
   wherein the gas-permeable layer extends to contact the source/drain region.

2. The semiconductor device of claim 1, wherein the first portion is connected to the second portion and the second portion is connected to the third portion such that the first, second, and third portions constitute one body.

3. The semiconductor device of claim 1, further comprising:
   an insulating layer between the second portion and the gas-permeable layer.

4. The semiconductor device of claim 1, wherein the active pattern extends in a first direction,
   wherein the gate structure extends in a second direction intersecting the first direction,
   wherein a first width of the first portion is greater than a second width of the second portion when viewed from a cross-sectional view taken along the first direction.

5. The semiconductor device of claim 4, wherein a third width of the first portion is greater than a fourth width of the second portion when viewed from a cross-sectional view taken along the second direction.

6. The semiconductor device of claim 4, wherein a third width of the first portion is smaller than a fourth width of the second portion when viewed from a cross-sectional view taken along the second direction.

7. The semiconductor device of claim 6, wherein the second portion includes an extension at a lower level than a second boundary between the first and second portions, and
   wherein the extension is spaced apart from the first portion.

8. The semiconductor device of claim 4, wherein a profile of a first sidewall of the first portion and a second sidewall of the second portion adjacent thereto is discontinuous when viewed from a cross-sectional view taken along the second direction, and
   wherein a profile of the second sidewall and a third sidewall of the third portion adjacent thereto is continuous when viewed from the cross-sectional view taken along the second direction.

9. The semiconductor device of claim 1, wherein the source/drain region comprises:
   a lower portion being in contact with the active pattern, the lower portion having substantially negatively inclined sidewalls; and
   an upper portion extending from the lower portion, the upper portion having substantially positively inclined sidewalls.

10. The semiconductor device of claim 9, wherein air gaps are formed under the sidewalls of the lower portion.

11. The semiconductor device of claim 1, wherein the active pattern includes a plurality of active patterns,
    wherein the source/drain region includes a plurality of source/drain regions respectively on the plurality of active patterns, and wherein the source/drain contact crosses over the plurality of active patterns and is connected in common to the plurality of source/drain regions.

12. The semiconductor device of claim 1, further comprising a device isolation pattern defining the active pattern and wherein the gas-permeable layer extends to contact the device isolation pattern.

13. The semiconductor device of claim 12, wherein a lower sidewall of the source/drain region is spaced apart from the gas-permeable layer to provide an air gap between the lower sidewall of the source/drain region and the gas-permeable layer.

14. The semiconductor device of claim 1, wherein the gas-permeable layer is configured to enable gases produced by hydrocarbon ashing to pass therethrough.

15. A semiconductor device comprising:
active patterns protruding from a substrate, the active patterns extending in a first direction, and the active patterns arranged along a second direction intersecting the first direction;
gate structures extending in the second direction and crossing over the active patterns;
gate spacers on sidewalls of the gate structures;
a plurality of source/drain regions respectively on the active patterns between the gate structures;
a source/drain contact connected to at least one source/drain region of the plurality of source/drain regions; and
a gas-permeable layer between the source/drain contact and one of the gate spacers,
wherein the source/drain contact comprises:
a first portion being in contact with the at least one source/drain region;
a second portion extending from the first portion, the second portion at a lower level than top surfaces of the gate structures; and
a third portion extending from the second portion, the third portion at a higher level than the top surfaces of the gate structures,
wherein a first width of the first portion is greater than a second width of the second portion when viewed from a cross-sectional view taken along the first direction; and
wherein the gas-permeable layer is in contact with the source/drain region.

16. A semiconductor device comprising:
an active fin on a substrate;
a gate structure crossing over the active fin;
a source/drain region on the substrate adjacent the gate structure;
a source/drain contact on the source/drain region and connected to the source/drain region, wherein the source/drain contact comprises a first portion in contact with the source/drain region and a second portion on the first portion; and
a gas-permeable capping layer on an upper surface of the first portion of the source/drain contact, wherein the second portion of the source/drain contact extends through the gas-permeable capping layer to contact the first portion of the source/drain contact,
wherein the gas-permeable capping layer extends to contact a sidewall of the first portion and the source/drain region.

17. The semiconductor device of claim 16, wherein the gate structure comprises a gate spacer, and the gas-permeable capping layer extends along a vertical sidewall of the gate spacer.

18. The semiconductor device of claim 16, wherein the second portion of the source/drain contact has a width that increases as a distance from the substrate increases.

19. The semiconductor device of claim 16, wherein the second portion of the source/drain contact has a width at an interface with the first portion of the source/drain contact that is less than a width of the first portion of the source/drain contact.

20. The semiconductor device of claim 16, wherein the gas-permeable capping layer comprises a silicon oxide layer or a porous silicon oxy-hydrocarbon layer.

* * * * *